United States Patent [19]
Yokoya et al.

[11] Patent Number: 5,304,454
[45] Date of Patent: Apr. 19, 1994

[54] IMAGE FORMING METHOD USING SILVER HALIDE, REDUCING AGENT AND POLYMERIZABLE COMPOUND

[75] Inventors: Hiroaki Yokoya; Keiji Takeda; Osami Tanabe; Katsuji Kitatani, all of Kanagawa, Japan

[73] Assignee: Fuji Photo Film Co., Ltd., Kanagawa, Japan

[21] Appl. No.: 878,996

[22] Filed: May 6, 1992

[30] Foreign Application Priority Data

May 7, 1991 [JP] Japan .................. 3-131791

[51] Int. Cl.$^5$ .............................. G03C 5/54
[52] U.S. Cl. .................. 430/255; 430/253; 430/254; 430/257; 430/291
[58] Field of Search ............ 430/199, 202, 203, 253, 430/254, 255, 291, 257

[56] References Cited

U.S. PATENT DOCUMENTS

| | | | |
|---|---|---|---|
| 2,596,756 | 5/1952 | Yutzy et al. | 430/255 |
| 2,852,371 | 9/1958 | Kendall | 430/255 |
| 3,080,230 | 3/1963 | Haydn et al. | 430/255 |
| 3,301,677 | 1/1967 | Konig et al. | 430/255 |
| 3,736,138 | 5/1973 | Held | 430/254 |
| 3,798,034 | 3/1974 | Laridon | 430/257 |
| 4,784,932 | 11/1988 | Nakamura et al. | 430/203 |
| 4,824,756 | 4/1989 | Nakamura | 430/254 |
| 5,001,032 | 3/1991 | Katayama et al. | 430/254 |
| 5,064,744 | 11/1991 | Fukui et al. | 430/255 |
| 5,087,549 | 2/1992 | Peiffer et al. | 430/253 |
| 5,122,443 | 6/1992 | Takeda | 430/253 |

Primary Examiner—Richard L. Schilling
Attorney, Agent, or Firm—Sughrue, Mion, Zinn, Macpeak & Seas

[57] ABSTRACT

The present invention provides 3 embodiments of a new image forming method. The image forming method uses a light-sensitive material and an removing sheet. The light-sensitive material comprises a support and a light-sensitive polymerizable layer provided thereon. Some embodiments of the light-sensitive material further have an adhesive layer. The light-sensitive polymerizable layer contains silver halide, a reducing agent and an ethylenically unsaturated polymerizable compound or/and a cross-linkable polymer. Some embodiments of the light-sensitive polymerizable layer further contain a colorant. The image forming method comprises an exposing step, a developing step and a removing step. Some embodiments of the image forming method further contains a toning step. The present invention is characterized in the removing step using a removing sheet.

17 Claims, 12 Drawing Sheets

IMAGE FORMING METHOD USING SILVER HALIDE, REDUCING AGENT AND POLYMERIZABLE COMPOUND

FIELD OF THE INVENTION

The present invention relates to an image forming method using a polymerization reaction initiated by silver halide. The invention also relates to an image forming method using a light-sensitive material which can be imaged with a scanning light such as a laser bean. The invention further relates to an image forming method which is advantageously used for forming a color proof.

BACKGROUND OF THE INVENTION

As the computer technology has recently been developed, a technical innovation is greatly introduced in printing. The field of color printing is now digitized by using a computer system named as CEPS (Color Electronic Prepress System). The CEPS digitizes the printing data of a color image and the data of all the prepress process down to stripping. Further, the newest system directly outputs the digitized printing data to a presensitized printing plate of a high sensitivity to prepare a printing plate without use of a conventional lith film. The technical innovation in the printing field makes the lith film unnecessary.

Before running on, a proofread is necessary to inspect the finished quality of printing. The proofing systems include a pressproof and an analogue offpress proof. The pressproof comprises preparing a printing plate for a proof sheet and printing an image using a proof press. The analogue offpress proof employs an image forming system different from the printing system. The offpress proof system comprises uniformly exposing to light a light-sensitive material through a lith film. The light-sensitive material contains a photopolymer, and the light source usually is ultraviolet. These two proofing systems are based on the premise that the printing system uses a lith film. The proof sheet itself is prepared from the image on the lith film (cf., M. H. Bruno, Principle of Color Proofing).

As is mentioned above, the conventional proofing systems are based on use of the lith film. Now, it is an important problem how to inspect the printing quality when the technical innovation in the printing field makes the lith film unnecessary. Therefore, the newest printing system requires a proof system of preparing a proof sheet directly from digital image data without use of the lith film. The required proof system is named as DDCP (Digital Direct Color Proof). With respect to the DDCP, several systems have been proposed, and some of them are practically used.

The DDCP systems employ an electrophotography and a thermal transfer recording system, which are completely different from the conventional analogue offpress proof using a photopolymer. The proofing qualities of DDCP (such as resolving power, color tone, gradation, reproducibility of half tone, analogy to printing and stable reproducibility of the image) are insufficient compared with the conventional systems. The image qualities of the direct output from a digital image are not satisfied. Therefore, an improved proofing method which can directly output the digital image is required to obtain a color proof of high quality.

Japanese Patent Publication No. 48(1973)-31323, Japanese Patent Provisional Publications No. 59(1984)-97140, . No. 62(1987)-267736, No. 2(1990)-244151 and U.S. Pat. No. 3,770,438 disclose an analogue offpress proof using a conventional photopolymer. If the digital image data can directly be recorded on the offpress prof using the photopolymer, the proofing qualities are probably satisfactory. However, the digital image data should be recorded on a light-sensitive material for proof by a scanning exposure using a specific light source such as a laser bean. Therefore, the light-sensitive material should have a high sensitivity to the wave length of the scanning light. The conventional light-sensitive material using a photopolymer does not have such a high sensitivity. Further, it is particularly difficult to sensitize the photopolymer to a laser beam of a long wave such as a He-Ne laser and a semiconductor laser. The photopolymer merely has a sensitivity to a laser beam of a short wave. Accordingly, the conventional analogue offpress proof is not available in the DDCP systems.

In conclusion, the offpress proof using a photopolymer cannot directly record the digital image data, since the photopolymer does not have a high sensitivity to the wave length of the scanning light (particularly a laser beam of a long wave). On the other hand, the proofing qualities of the conventional DDCP systems (using an electrophotography or a thermal transfer recording system) are insufficient with respect to resolving power, reproducibility of half tone or stable reproducibility of color. Therefore, a new DDCP method is required to record a color proof of high quality with a high sensitivity to the wave length of a scanning light.

By the way, Japanese Patent Provisional Publications No. 61(1986)-69062 and No. 61(1986)-73145 (the contents of these two publications are described in U.S. Pat. No. 4,629,676 and European Patent Provisional Publication No. 0174634A) discloses an image forming method using a light-sensitive material which contains silver halide, a reducing agent and a polymerizable compound. The method comprises the steps of imagewise exposing to light the light-sensitive material, and heating the material to develop the silver and to harden imagewise the polymerizable compound. Thus a polymer image is formed on the light-sensitive material. In a representative embodiment of the method, the developed light-sensitive material (containing a colorant) is pressed on an image receiving material to transfer the colorant with the unpolymerized polymerizable compound to the image receiving material. Thus a color image is formed on the image receiving material. In another embodiment, the unhardened area of the polymerizable compound containing the colorant is removed with a solvent to form a color image on the light-sensitive material.

SUMMARY OF THE INVENTION

The present inventors paid attention to the image forming method using a polymerization reaction initiated by silver halide, and have tried to apply the method to formation of a color proof. However, the inventors note some problems when the image forming method itself is applied to the color proof.

For example, the light-sensitive material should be dried in the case that the unhardened area is removed with a solvent. The drying process requires several tens of seconds. Accordingly, the removing process using a solvent increases the whole processing time. Further, a heat development has an advantage of a dry process.

Where the removing process using a solvent (a set process) is contained in a method, the advantage of the heat development process can not be so effective in the whole method. Furthermore, a waste solvent should be treated in an appropriate way.

An object of the present invention is to improve the image forming method using a polymerization reaction initiated by silver halide and to provide a method advantageously used for forming a color proof.

Another object of the invention is to provide an image forming method which can form a color proof directly from digital image data without use of a lith film.

A further object of the invention is to provide an image forming method which forms a color proof of a high quality by a scanning exposure with a laser beam, particularly a laser beam of a long wave.

A still further object of the invention is to provide an image forming method which can form a hardened image with a low exposure energy, whereby a color proof is made from the hardened image The present invention provides an image forming method comprises the following three embodiments.

The first embodiment of the present invention is a method which uses a light-sensitive material and a removing sheet. The light-sensitive material comprises a support and a light-sensitive polymerizable layer. The light-sensitive polymerizable layer contains silver halide, a reducing agent, an ethylenically unsaturated polymerizable compound or/and a cross-linkable polymer and a colorant.

The first embodiment comprises the steps of:

(1) imagewise exposing to light the light-sensitive polymerizable layer (hereinafter referred to as an exposing step);

(2) developing the light-sensitive polymerizable layer to harden the ethylenically unsaturated polymerizable compound or/and the cross-linkable polymer within the exposed area or, in the alternative, within the unexposed area (hereafter referred to as a developing step); and then (3) placing the surface of the light-sensitive polymerizable layer in contact with the removing sheet and peeling the sheet to remove the unhardened area or, in the alternative, the hardened area with the sheet to obtain a hardened image whereby a color image is formed (hereinafter referred to as a removing step).

The second embodiment of the invention is a method which uses a light-sensitive material and a removing sheet. The light-sensitive material comprises a support, an adhesive layer and a light-sensitive polymerizable layer. The light-sensitive polymerizable layer contains silver halide, a reducing agent and an ethylenically unsaturated polymerizable compound or/and a cross-linkable polymer.

The second embodiment comprises the steps of:

(1) imagewise exposing to light the light-sensitive polymerizable layer (an exposing step);

(2) developing the light-sensitive polymerizable layer to harden the ethylenically unsaturated polymerizable compound or/and the cross-linkable polymer within the exposed area or, in the alternative, within the unexposed area (a developing step);

(3) placing the surface of the light-sensitive polymerizable layer in contact with the removing sheet and peeling the sheet to remove the unhardened area with the sheet to obtain a hardened image whereby the adhesive layer is imagewise exposed (a removing step); and then (4) applying color toner on the surface of the adhesive layer whereby a toner image is formed (hereinafter referred to as a toning step).

The third embodiment of the invention is a method which uses a light-sensitive material and a removing sheet. The light-sensitive material comprises a support and a light-sensitive polymerizable layer. The light-sensitive polymerizable layer contains silver halide, a reducing agent and an ethylenically unsaturated polymerizable compound or/and a cross-linkable polymer.

The third embodiment comprises the steps of:

(1) imagewise exposing to light the light-sensitive polymerizable layer (an exposing step);

(2) developing the light-sensitive polymerizable layer to harden the ethylenically unsaturated polymerizable compound or/and the cross-linkable polymer within the exposed area or, in the alternative, within the unexposed area (a developing step);

(3) placing the surface of the light-sensitive polymerizable layer in contact with the removing sheet and peeling the sheet to remove the hardened area with the sheet to obtain a hardened image whereby the adhesive unhardened area is imagewise formed (a removing step); and then (4) applying color toner on the surface of the adhesive unhardened area whereby a toner image is formed (a toning step).

In the three embodiments, the light-sensitive polymerizable layer preferably comprises a light-sensitive layer containing the silver halide and a polymerizable layer containing the ethylenically unsaturated polymerizable compound or/and the cross-linkable polymer.

The colorant used in the first embodiment is contained in the polymerizable layer. The reducing agent may be contained in the light-sensitive layer or/and the polymerizable layer. Further, the light-sensitive polymerizable layer may comprise a light-sensitive layer, a polymerizable layer and an image formation accelerating layer. The reducing agent may also be contained in the image formation accelerating layer. In the present specification, the light-sensitive polymerizable layer comprising two or more functional layers is referred to as "a complex light-sensitive polymerizable layer". A light-sensitive material having the complex light-sensitive polymerizable layer is referred to as "a multi-layered light-sensitive material". On the other hand, a light-sensitive material having a single light-sensitive polymerizable layer is referred to as "a single-layered light-sensitive material".

In the transferring types (which are described below) of the first and third embodiments, a polymerizable layer is provided on a support, and a light-sensitive layer is provided thereon. In the lamination types (which are described below) of first and third embodiments, a light-sensitive layer is provided on a support, and a polymerizable layer is provided thereon. In the transferring type of the second embodiment, an adhesive layer is provided on a support, a polymerizable layer is provided thereon, and a light-sensitive layer is further provided thereon. In the laminating type of the second embodiment, a light-sensitive layer is provided on a support, a polymerizable layer is provided thereon, and an adhesive layer is further provided thereon.

When a multi-layered light-sensitive material is used, the light-sensitive layer should be removed before the removing step (after the developing step) or simultaneously with the removing step. In the case that layers other than the light-sensitive layer and the polymerizable layer is provided on a support, the layer provided on or above the polymerizable layer should also be removed.

A transferring step can be conducted after the removing step (3) of the first embodiment or after the toning step (4) of the second and third embodiments. The transferring step comprises placing the light-sensitive material in contact with an image receiving material whereby the color image or the toner image is transferred to the image receiving material. The embodiment containing the transferring step is referred to as "transferring type".

A laminating step and a peeling step can be added to the method in place of the transferring step. The embodiment containing the laminating step and the peeling step is referred to as "laminating type".

The laminating type of the first embodiment comprises the steps of:

(A) laminating the light-sensitive material on an image-receiving material (hereinafter referred to as a laminating step);

(B) peeling the support of the light-sensitive material from the lamination of the light-sensitive material and the image-receiving material (hereinafter referred to as a peeling step);

(1) imagewise exposing to light the light-sensitive polymerizable layer (an exposing step);

(2) developing the light-sensitive polymerizable layer to harden the ethylenically unsaturated polymerizable compound or/and the cross-linkable polymer within the exposed area or, in the alternative, within the unexposed area (a developing step); and (3) placing the surface of the light-sensitive polymerizable layer in contact with the removing sheet and peeling the sheet to remove the unhardened area or, in the alternative, the hardened area with the sheet to obtain a hardened image whereby a color image is formed (a removing step), wherein the order is selected from:

(A)→(B)→(1)→(2)→(3);

(A)→(1)→(B)→(2)→(3);

(A)→(1)→(2)→(B)→(3);

(1)→(A)→(B)→(2)→(3);

(1)→(A)→(2)→(B)→(3); and (1)→(2)→(A)→(B)→(3).

The laminating type of the second embodiment comprises the steps of:

(A) laminating the light-sensitive material on an image-receiving material (a laminating step);

(B) peeling the support of the light-sensitive material from the lamination of the light-sensitive material and the image-receiving material (a peeling step);

(1) imagewise exposing to light the light-sensitive polymerizable layer (an exposing step);

(2) developing the light-sensitive polymerizable layer to harden the ethylenically unsaturated polymerizable compound or/and the cross-linkable polymer within the exposed area or, in the alternative, within the unexposed area (a developing step); and (3) placing the surface of the light-sensitive polymerizable layer in contact with the removing sheet and peeling the sheet to remove the unhardened area with the sheet to obtain a hardened image whereby the adhesive layer is imagewise exposed (a removing step); and (4) applying color toner on the surface of the adhesive layer whereby a toner image is formed (a toning step), wherein the order is selected from:

(A)→(B)→(1)→(2)→(3)→(4);

(A)→(1)→(B)→(2)→(3)→(4);

(A)→(1)→(2)→(B)→(3)→(4);

(1)→(A)→(B)→(2)→(3)→(4);

(1)→(A)→(2)→(B)→(3)→(4); and (1)→(2)→(A)→(B)→(3)→(4).

The laminating type of the third embodiment comprises the steps of:

(A) laminating the light-sensitive material on an image-receiving material (a laminating step);

(B) peeling the support of the light-sensitive material from the lamination of the light-sensitive material and the image-receiving material (a peeling step);

(1) imagewise exposing to light the light-sensitive polymerizable layer (an exposing step);

(2) developing the light-sensitive polymerizable layer to harden the ethylenically unsaturated polymerizable compound or/and the cross-linkable polymer within the exposed area or, in the alternative, within the unexposed area (a developing step);

(3) placing the surface of the light-sensitive polymerizable layer in contact with the removing sheet and peeling the sheet to remove the hardened area with the sheet to obtain a hardened image whereby the adhesive unhardened area is imagewise formed (a removing step); and (4) applying color toner on the surface of the adhesive unhardened area whereby a toner image is formed (a toning step), wherein the order is selected from:

(A)→(B)→(1)→(2)→(3)→(4);

(A)→(1)→(B)→(2)→(3)→(4);

(A)→(1)→(2)→(B)→(3)→(4);

(1)→(A)→(B)→(2)→(3)→(4);

(1)→(A)→(2)→(B)→(3)→(4); and (1)→(2)→(A)→(B)→(3)→(4).

The above-mentioned steps are preferably repeated twice or more using light-sensitive materials or color toners each having a color different from each other, to form a multicolor image on the image receiving material. The color is determined by the kind of the colorant or the color toner.

In the present invention, two or more steps can be conducted simultaneously provided that the above-defined order is not reversed. For example, the exposing step (1) can be conducted simultaneously with the developing step (2). A process conducting two or more steps simultaneously is included within the scopes of the present invention.

The image forming method is characterized in that a removing sheet is used in place of a solvent. The unhardened area or, in the alternative, the hardened area is removed with the sheet at the removing step. The process using the removing sheet can be conducted by an easy and short time operation. Further, the image forming method can be conducted by a completely dry process. Moreover, there is no need of treating a waste solvent. Thus the problem of the image forming method using a polymerization reaction initiated by silver halide is solved by the present invention. This method now can be applied to formation of a color proof.

Therefore, a color proof can be formed directly from digital image data without use of a lith film. Further, a color proof of a high quality can be formed by a scanning exposure with a laser beam, particularly a laser beam of a long wave. Furthermore, a hardened image can be formed with a low exposure energy Further, the following effects can be obtained by using the specific embodiments of the present invention.

1. In the second and third embodiments of the present invention, color toner is used to obtain a color image. The color toner has the following advantages (1) to (5) compared with the colorant contained in the light-sensitive material.

(1) The color tone of an image can easily be altered by changing the color toner. There is no need of preparing various light-sensitive materials with respect to colors. Only one kind of the light-sensitive material can form all the colors. Accordingly, the color tone can optionally be determined within a wide range of choice.

(2) A dye or pigment having a function of inhibiting a polymerization reaction can be used as a color toner. The inhibiting function must be checked in the case that a colorant is contained in the light-sensitive material.

(3) There is an upper limit on the amount of the colorant contained in the light-sensitive material. On the other hand, there is no upper limit on the amount of the toner. Therefore, a very high maximum density of an image can be obtained by using a large amount of the toner.

(4) Some of the functional components of the exposing or developing step such as silver halide, has an influence on the color tone of the colorant. The color toner is free from the influence.

(5) In the light-sensitive material containing a dye or pigment as a colorant, the sensitivity of silver halide is reduced by the colorant. On the other hand, a color image formed from a leuco dye is unstable. The color toner forms a stable color image without reducing the sensitivity of silver halide.

2. The laminating types of the embodiments have an advantage of easy adjustment and easy operation with respect to the setting of an image.

3. In some embodiments, the unhardened area may be removed with the sheet to form an image within the hardened area. The unhardened area, which is mechanically weak, does not relate to the image formation. Therefore, the reproducibility of a minute image such as a half tone is improved to form a clear image in these embodiments.

4. In the multi-layered light-sensitive material having a light-sensitive layer and a polymerizable layer, silver halide does not influence on the color tone of the polymerizable layer.

Further, the components of the light-sensitive layer such as silver halides are not contained in the polymerizable layer. Therefore, the polymer image formed in the polymerizable layer has a high mechanical strength, since the polymerizable layer substantially consists of only the polymerizable compound or the cross-linkable polymer. A clear color image can be formed from the strong polymer image.

5. In the previous image forming method using a polymerization reaction initiated by silver halide, two or more kinds of microcapsules each containing a colorant different different from each other are used in a light-sensitive material to form a multicolor image on an image receiving material.

On the other hand, in the method of the present invention, the above-mentioned steps are repeated twice or more using light-sensitive materials or color toners each having a color different from each other, to form a multicolor image on an image receiving material. This method has the following advantages (1) to (4) compared with the previous method.

(1) Using the microcapsules, the resolving power of the light-sensitive material is limited to the size of the microcapsules. There is no such limitation on the method of the invention.

(2) The microcapsules are ruptured by pressure to form an image. The resolving power is more degraded than the size of the microcapsules, since the contents of the microcapsules are spread by the pressure. There is no such problem on the method of the invention.

(3) The amount of the colorant contained in the microcapsule is severely limited. On the other hand, a relatively large amount of the colorant can be contained in the light-sensitive material even in the first embodiment of the present invention. Of course, there is no upper limit on the amount of the color toner. Therefore, a high maximum density of an image can be obtained according to the present invention.

(4) The printed matter has overlap of color (ink). The method using microcapsules cannot reproduce the overlap. The method of the invention can reproduce the overlap by repeating the above-mentioned steps where the color of the colorant or toner corresponds to the color of the ink ion the printed matter. Therefore, the present invention can form an excellent color prof having a color tone which is very similar to that of the printed matter.

DETAILED DESCRIPTION OF THE INVENTION

Figure 1:
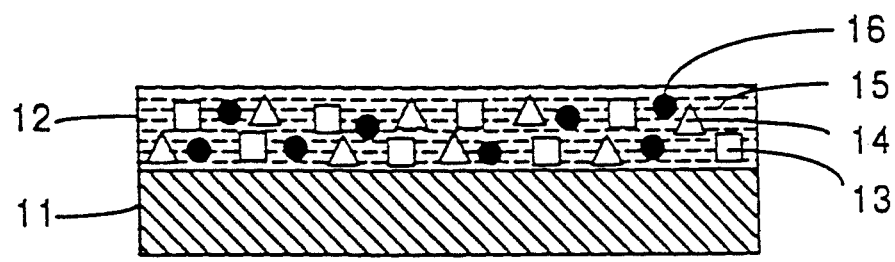
FIG. 1 is a sectional view schematically illustrating a single-layered light-sensitive material used in the first embodiment of the image forming method of the present invention.

First, preferred embodiments of the present invention are described below.

(1) The light-sensitive polymerizable layer preferably comprises a light-sensitive layer containing the silver halide and a polymerizable layer containing the ethylenically unsaturated polymerizable compound or/and the cross-linkable polymer.

(2) A transferring step is added to the method (transferring type).

(3) A laminating step and a peeling step are added to the method (laminating type).

(4) The steps of each of the embodiments are preferably repeated twice or more using light-sensitive materials each having a color different from each other, to form a multicolor image on the image receiving material.

(5) The light-sensitive material is preferably developed by heating. The heating temperature is preferably in the range of 70° to 200° C.

(6) The light-sensitive polymerizable layer preferably further contains a base or base precursor. With respect to the complex light-sensitive polymerizable layer, the base or base precursor can be contained in the light-sensitive layer or/and the polymerizable layer. The base precursor is preferred to the base. The base or base precursor may be contained in an image formation accelerating layer.

(7) The light-sensitive polymerizable layer may further contain a heat development accelerator. With respect to the complex light-sensitive polymerizable layer, the heat development accelerator is preferably contained in the polymerizable layer. The heat development accelerator may be contained in an image formation accelerating layer.

(8) In the case of a multi-layered light-sensitive material, the light-sensitive layer preferably contains a hydrophilic binder (9) The light-sensitive polymerizable layer (the light-sensitive layer or the polymerizable layer of the multi-layered light-sensitive material) or the adhesive layer (of the second embodiment) may further contain a substance which absorbs the exposing light from the light source.

(10) The light-sensitive material may have a layer containing a substance which absorbs the exposing light from the light source on the side of the light-sensitive polymerizable layer.

(11) The light-sensitive material may have a layer containing a substance which absorbs the exposing light from the light source on the reverse side of the light-sensitive polymerizable layer (the back side of the support).

(12) The light-sensitive material may have a protective layer as the uppermost layer.

(13) The light-sensitive material may have an image formation accelerating layer which contains one selected from a reducing agent, a base, a base precursor and a heat development accelerator.

(14) After the image is formed on the image receiving material, the image may be further transferred to the secondary image receiving material.

Next, the layered structure of the (single-layered or multi-layered) light-sensitive material used in the image forming method of the present invention is described below referring to the drawings.

FIG. 1 is a sectional view schematically illustrating a single-layered light-sensitive material used in the first embodiment of the image forming method of the present invention. A single light-sensitive polymerizable layer (12) is provided on a support (11). The light-sensitive polymerizable layer (12) contains silver halide (13), a reducing agent (14), an ethylenically unsaturated polymerizable compound or/and a cross-linkable polymer (15) and a colorant (16).

Figure 2:
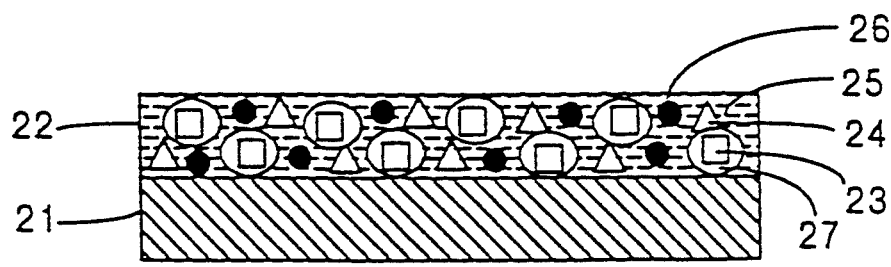
FIG. 2 is a sectional view schematically illustrating another embodiment of a single-layered light-sensitive material used in the first embodiment of the image forming method.

FIG. 2 is a sectional view schematically illustrating another embodiment of a single-layered light-sensitive material used in the first embodiment of the image forming method. A single light-sensitive polymerizable layer (22) is provided on a support (21) in the same manner as in the embodiment shown in FIG. 1. However, a hydrophilic phase (27) containing silver halide (23) is separated from and finely dispersed in a hydrophobic phase containing the other components, namely a reducing agent (24), an ethylenically unsaturated polymerizable compound or/and a cross-linkable polymer (25) and a colorant (26).

As is shown in FIG. 2, a phase separation may be caused in the light-sensitive polymerizable layer. In other words, it is not necessary to form the light-sensitive polymerizable layer as a uniform layer. The phase separation can also be caused in the light-sensitive polymerizable layer of the other single-layered light-sensitive materials described below.

Figure 3:
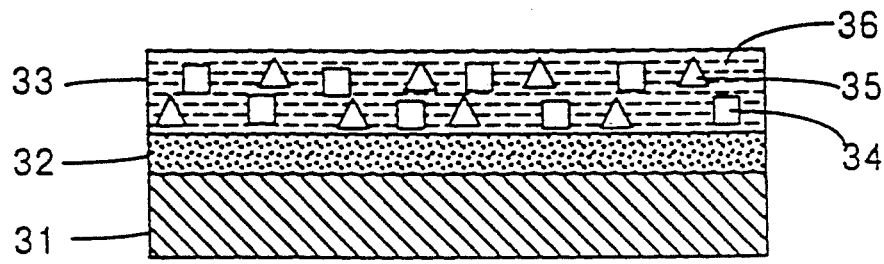
FIG. 3 is a sectional view schematically illustrating a single-layered light-sensitive material used in the second embodiment (transferring type) of the image forming method.

FIG. 3 is a sectional view schematically illustrating a single-layered light-sensitive material used in the second embodiment (transferring type) of the image forming method. An adhesive layer (32) is provided on a support (31), and a light-sensitive polymerizable layer (33) is provided on the adhesive layer (32). The light-sensitive polymerizable layer (33) contains silver halide (34), a reducing agent (35) and an ethylenically unsaturated polymerizable compound or/and a cross-linkable polymer (36).

Figure 4:
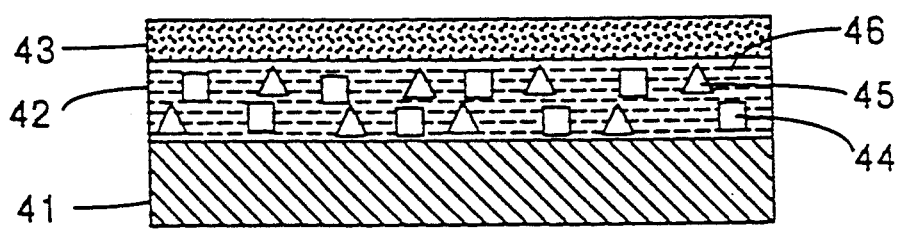
FIG. 4 is a sectional view schematically illustrating a single-layered light-sensitive material used in the second embodiment (laminating type) of the image forming method.

FIG. 4 is a sectional view schematically illustrating a single-layered light-sensitive material used in the second embodiment (laminating type) of the image forming method. A light-sensitive polymerizable layer (42) is provided on a support (41), and an adhesive layer (43) is provided on the light-sensitive polymerizable layer (42). The light-sensitive polymerizable layer (42) contains silver halide (44), a reducing agent (45) and an ethylenically unsaturated polymerizable compound or/and a cross-linkable polymer (46).

Figure 5:
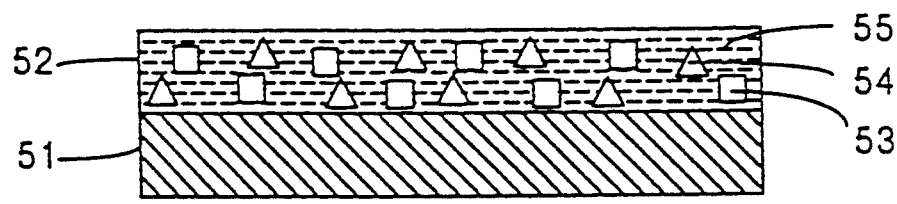
FIG. 5 is a sectional view schematically illustrating a single-layered light-sensitive material used in the third embodiments of the image forming method.

FIG. 5 is a sectional view schematically illustrating a single-layered light-sensitive material used in the third embodiment of the image forming method. A light-sensitive polymerizable layer (52) is provided on a support (51). the light-sensitive polymerizable layer (52) contains silver halide (53), a reducing agent (54) and an ethylenically unsaturated polymerizable compound or/and a cross-linkable polymer (55).

Figure 6:
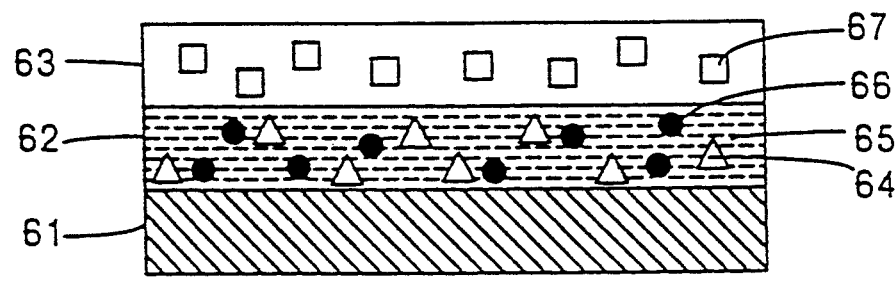
FIG. 6 is a sectional view schematically illustrating a multi-layered light-sensitive material used in the first embodiment (transferring type) of the image forming method.

FIG. 6 is a sectional view schematically illustrating a multi-layered light-sensitive material used in the first embodiment (transferring type) of the image forming method. A polymerizable layer (62) is provided on a support (61), and a light-sensitive layer (63) is provided on the polymerizable layer (62). The polymerizable layer (62) contains a reducing agent (64), an ethylenically unsaturated polymerizable compound or/and a cross-linkable polymer (65) and a colorant (66). The light-sensitive layer (63) contains silver halide (67).

The reducing agent can be contained in the light-sensitive layer (63) though the reducing agent (64) is contained in the polymerizable layer (62) of the light-sensitive material shown in FIG. 6. The reducing agent may be contained in both of the polymerizable layer and the light-sensitive layer in any ratio of the amount. Further, the reducing agent may be contained in an image formation accelerating layer. Similarly, the reducing agent can also be contained in any layers of the other light-sensitive materials described below.

Figure 7:
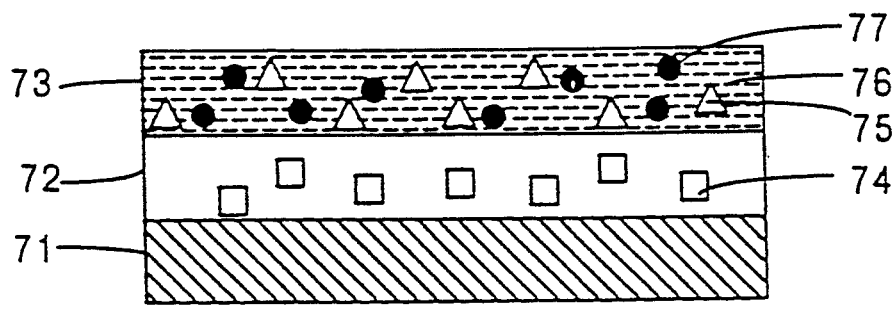
FIG. 7 is a sectional view schematically illustrating a multi-layered light-sensitive material used in the first embodiment (laminating type) of the image forming method.

FIG. 7 is a sectional view schematically illustrating a multi-layered light-sensitive material used in the first embodiment (laminating type) of the image forming method. A light-sensitive layer (72) is provided on a support (71), and a polymerizable layer (73) is provided on the light-sensitive layer (72). The light-sensitive layer (72) contains silver halide (74). The polymerizable layer (73) contains a reducing agent (75), an ethylenically unsaturated polymerizable compound or/and a cross-linkable polymer (76) and a colorant (77).

Figure 8:
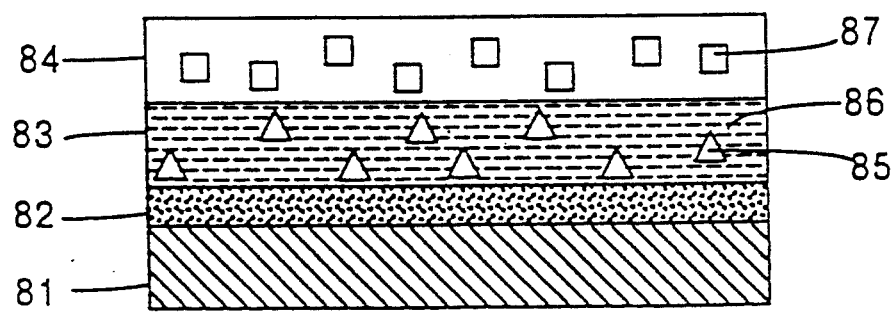
FIG. 8 is a sectional view schematically illustrating a multi-layered light-sensitive material used in the second embodiment (transferring type) of the image forming method.

FIG. 8 is a sectional view schematically illustrating a multi-layered light-sensitive material used in the second embodiment (transferring type) of the image forming method. An adhesive layer (82) is provided on a support (81), a polymerizable layer (83) is provided on the adhesive layer (82), and a light-sensitive layer (84) is provided on the polymerizable layer (83). The polymerizable layer (83) contains a reducing agent (85) and an ethylenically unsaturated polymerizable compound or/and a cross-linkable polymer (86). The light-sensitive layer (84) contains silver halide (87).

Figure 9:
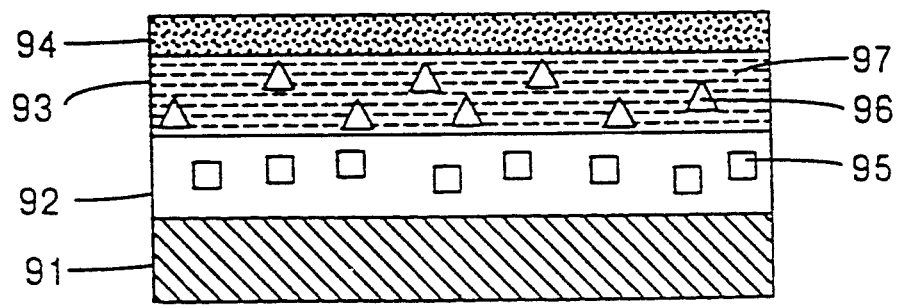
FIG. 9 is a sectional view schematically illustrating a multi-layered light-sensitive material used in the second embodiment (laminating type) of the image forming method.

FIG. 9 is a sectional view schematically illustrating a multi-layered light-sensitive material used in the second embodiment (laminating type) of the image forming method. A light-sensitive layer (92) is provided on a support (91), a polymerizable layer (93) is provided on the light-sensitive layer (92) and an adhesive layer (94) is provided on the polymerizable layer (93). The light-sensitive layer (92) contains silver halide (95). The polymerizable layer (93) contains a reducing agent (96) and an ethylenically unsaturated polymerizable compound or/and a cross-linkable polymer (97).

Figure 10:
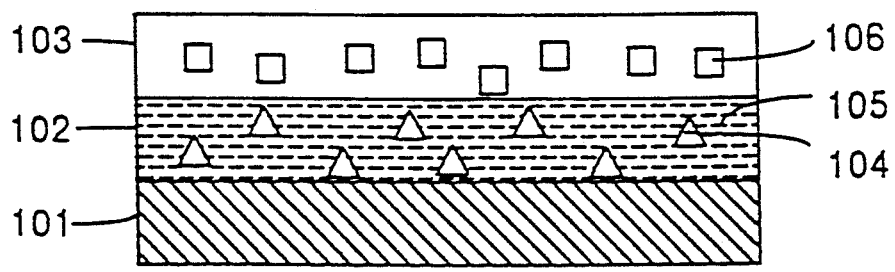
FIG. 10 is a sectional view schematically illustrating a multi-layered light-sensitive material used in the third embodiment (transferring type) of the image forming method.

FIG. 10 is a sectional view schematically illustrating a multi-layered light-sensitive material used in the third embodiment (transferring type) of the image forming method. A polymerizable layer (102) is provided on a support (101), and a light-sensitive layer (103) is provided on the polymerizable layer (102). The polymerizable layer (102) contains a reducing agent (104) and an ethylenically unsaturated polymerizable compound or/and a cross-linkable polymer (105). The light-sensitive layer (103) contains silver halide (106).

Figure 11:
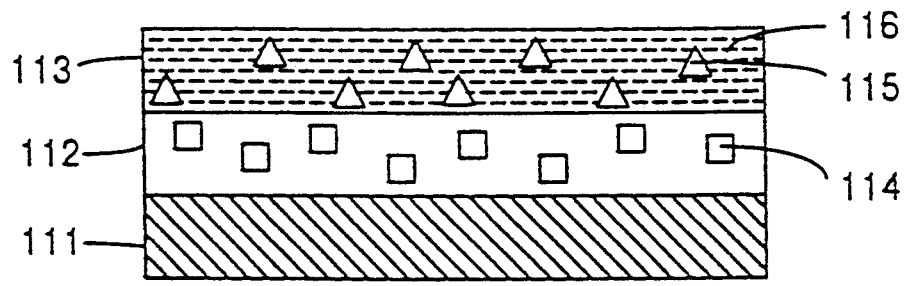
FIG. 11 is a sectional view schematically illustrating a multi-layered light-sensitive material used in the third embodiment (laminating type) of the image forming method.

FIG. 11 is a sectional view schematically illustrating a multi-layered light-sensitive material used in the third embodiment (laminating type) of the image forming method. A light-sensitive layer (112) is provided on a support (111, and a polymerizable layer (113) is provided on the light-sensitive layer (112). The light-sensitive layer (112) contains silver halide (114). The polymerizable layer (113) contains a reducing agent (115)

and an ethylenically unsaturated polymerizable compound or/and a cross-linkable polymer (116).

The above-described layered structures are examples of the light-sensitive material. The present invention is not limited to the examples.

For example, optional layers such as an undercoating layer, an overcoating layer (e.g., a protective layer or a cover sheet), an intermediate layer and a backing layer can be provided on the light-sensitive material. The undercoating layer is provided on the support. The overcoating layer is provided as the uppermost layer. The intermediate layer is provided between the functional layers. The backing layer is provided on the reverse side of the light-sensitive polymerizable layer (the back side of the support).

In the case that an overcoating layer is provided in the light-sensitive material of the first, third or fifth embodiment, the overcoating layer should be removed before or simultaneously with the removing step.

In the case that an overcoating layer is provided in the light-sensitive material of the second, fourth or sixth embodiment, the overcoating layer should be removed before the laminating step.

The embodiments of the image forming method of the present invention are described below referring to the drawings.

Figure 12:
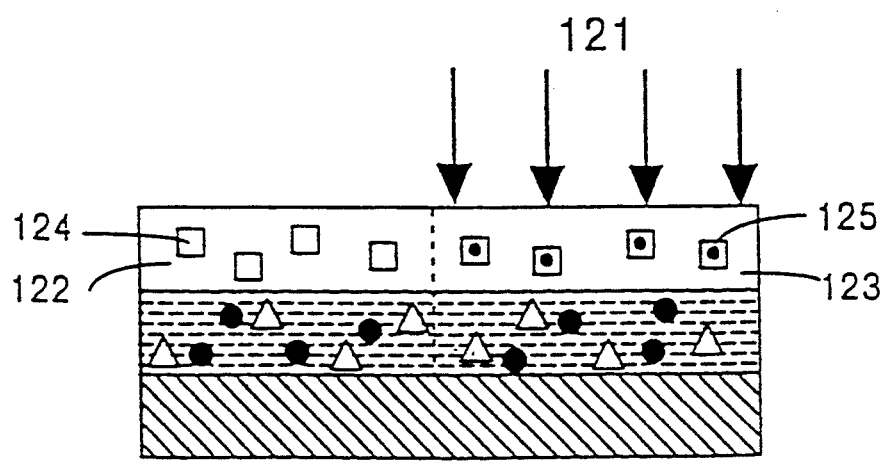
FIG. 12 is a sectional view schematically illustrating the exposing step of the first embodiment (transferring type) of the image forming method.

FIG. 12 is a sectional view schematically illustrating the exposing step of the first embodiment (transferring type) of the image forming method. A latent image of silver halide (125) is formed within the exposed area (123), where the light-sensitive layer is exposed to light (121). On the other hand, silver halide (124) within the unexposed area (122) is not substantially changed.

The exposing step is described in FIG. 12 by using a multi-layered light-sensitive material shown in FIG. 6. The single-layered light-sensitive material shown in FIG. 1 can also be exposed to light in the same manner. The image forming method is further described below by using a multi-layered light-sensitive material. Of course, the single-layered light-sensitive material can also be treated in the same manner.

Figure 13:
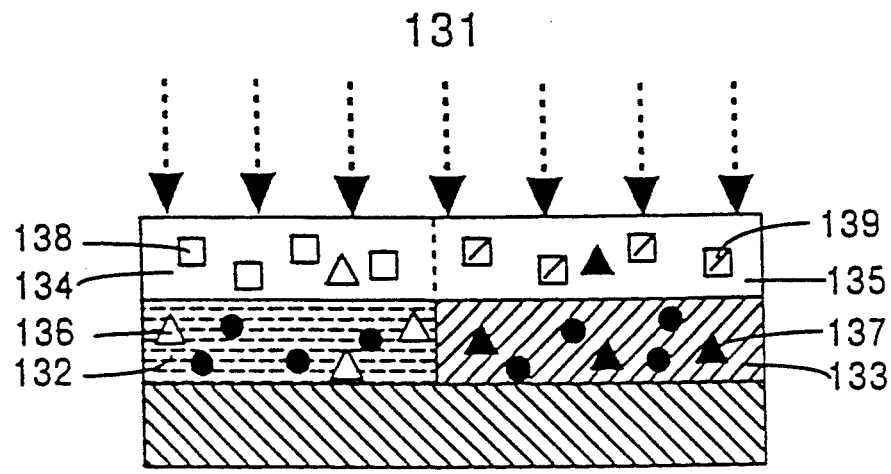
FIG. 13 is a sectional view schematically illustrating the developing step of the first embodiment (transferring type) of the image forming method.

FIG. 13 is a sectional view schematically illustrating the developing step of the first embodiment (transferring type) of the image forming method. When the light-sensitive material is heated (131), a reducing agent is moved from a polymerizable layer (132 and 133) to a light-sensitive layer (134 and 135). The reducing agent develops the latent image of silver halide within the exposed area of the light-sensitive layer (135). A silver image (139) is formed from the developed silver halide, and the reducing agent is simultaneously oxidized to form an oxidation product. The oxidation product is unstable in the system of the present invention to form a radical (137). This radical is hereinafter referred to as "oxidation radical". The oxidation radical of the reducing agent (137) is moved from the exposed area of the light-sensitive layer (135) to the exposed area of the polymerizable layer (133). An ethylenically unsaturated polymerizable compound or/and a cross-linkable polymer is hardened by the function of the radical. Thus, the hardened area (133) is formed. On the other hand, the reducing agent (136) contained in the unexposed area of the polymerizable layer and silver halide (138) contained in the light-sensitive layer are not substantially changed. Thus, the unexposed area of the polymerizable layer (132) is not hardened.

The developing step is described in FIG. 13 by using a heat development process. The developing step can also be conducted by a wet development process using a developing solution. Further, the developing step is described in FIG. 13 by using a system wherein the ethylenically unsaturated polymerizable compound or/and the cross-linkable polymer is hardened within the exposed area. The other system wherein the compound or/and the polymer is hardened within the unexposed area is also available by changing the conditions such as the kind of the reducing agent. The details are described at the item of [Reducing agent].

The image forming method is further described below by using a heat-development process and a system wherein the compound or/and the polymer is hardened within the exposed area. Of course, the wet development process and the system wherein the compound or/and the polymer is hardened within the unexposed area can also be available in the same manner.

Figure 14:
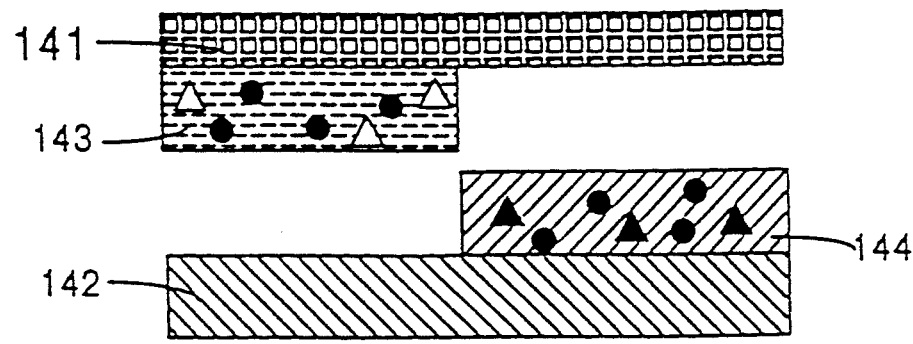
FIG. 14 is a sectional view schematically illustrating the removing step of the first embodiment (transferring type) of the image forming method.

FIG. 14 is a sectional view schematically illustrating the removing step of the first embodiment (transferring type) of the image forming method. A removing sheet (141) is placed in contact with the light-sensitive material (142) and peeled from the material. The unhardened area (143) is transferred to the removing sheet. The hardened area (144) remains in the light-sensitive material. Thus a color image is formed within the hardened area. The light-sensitive layer is peeled before the removing step, or is removed together the unhardened area of the polymerizable layer with the sheet at the removing step.

The removing step is described in FIG. 14 by an embodiment wherein the unhardened area is removed. The hardened area can also be removed by changing the conditions of the removing step such as the amount and nature of the polymerizable compound or cross-linkable polymer, pressure and temperature. The details are described at the item of [Removing step].

Figure 15:
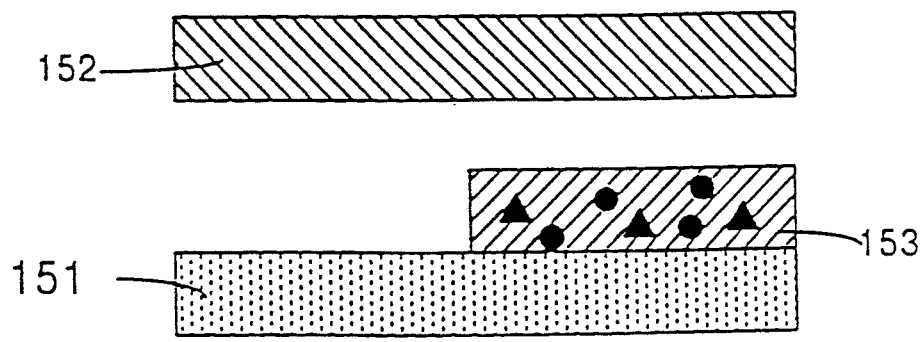
FIG. 15 is a sectional view schematically illustrating the transferring step of the first embodiment (transferring type) of the image forming method.

FIG. 15 is a sectional view schematically illustrating the transferring step of the first embodiment (transferring type) of the image forming method. FIG. 15 shows an image receiving material (151) and a light-sensitive material (152) just after the image is transferred. The light-sensitive material (152) is placed in contact with the image receiving material (151). Thus, the color image (153) formed on the hardened area is transferred from the light-sensitive material to the image receiving material. In the embodiment wherein the hardened area is removed at the removing step, the color image formed within the unhardened is transferred to the image receiving material.

As is described in FIG. 12 to FIG. 15, the transferring type of the first embodiment of the present invention comprises the steps of:

(1) imagewise exposing to light the light-sensitive polymerizable layer (the exposing step shown in FIG. 12);

(2) developing the light-sensitive polymerizable layer to harden the ethylenically unsaturated polymerizable compound or/and the cross-linkable polymer within the exposed area or, in the alternative, within the unexposed area (the developing step shown in FIG. 13);

(3) placing the surface of the light-sensitive polymerizable layer in contact with the removing sheet and peeling the sheet to remove the unhardened area or, in the alternative, the hardened area with the sheet to obtain a hardened image whereby a color image is formed (the removing step shown in FIG. 14); and then (4) placing the light-sensitive material in contact with the image receiving material whereby the color image is transferred to the image receiving material (the transferring step shown in FIG. 15).

An image is formed on the image receiving material according to the above-mentioned steps. The steps (1) to (4) may be repeated using a light-sensitive material having another color to form a two-color image on the image receiving material. The steps (1) to (4) may be further repeated with respect to the other colors to form a full color image on the image receiving material.

Figure 16:
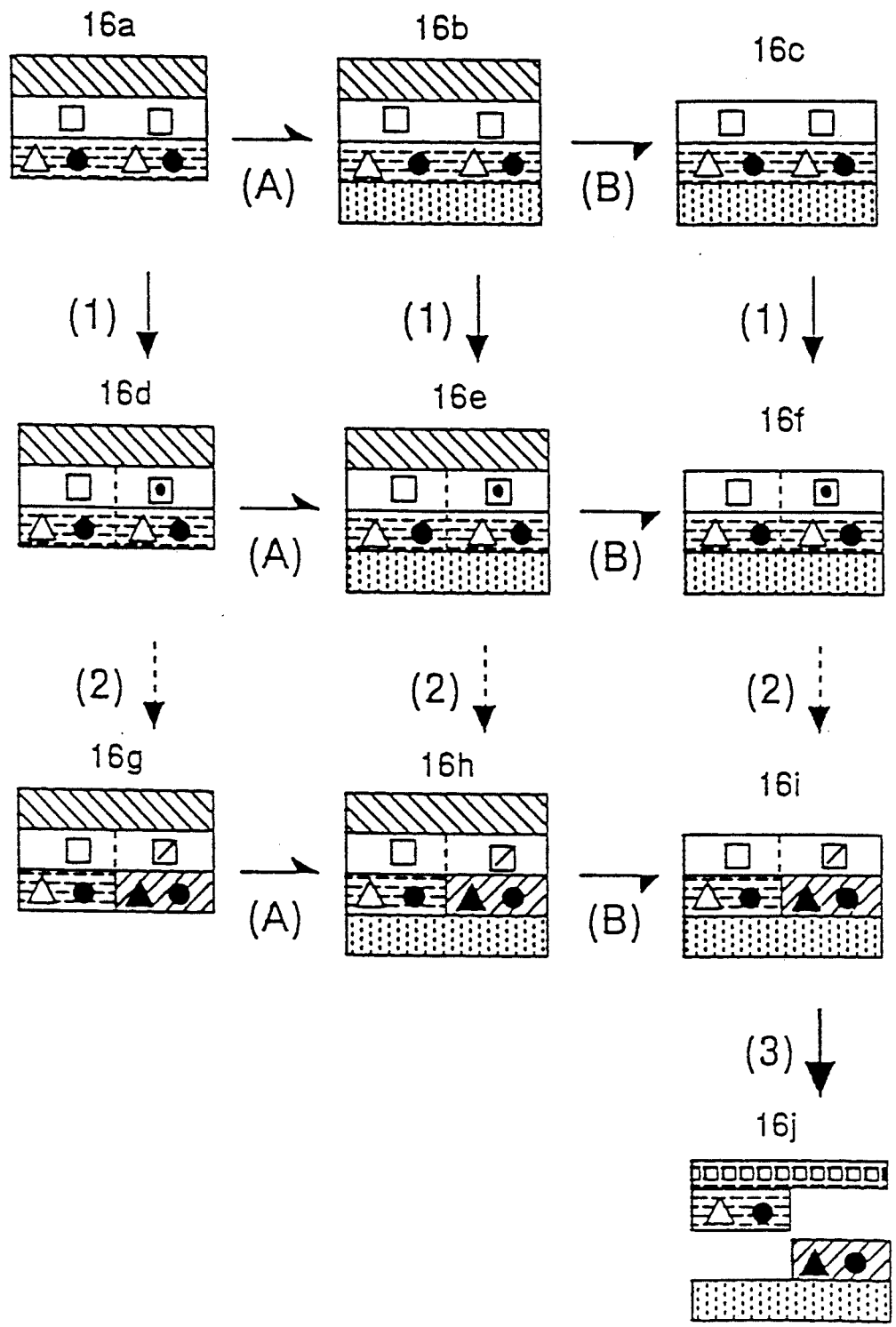
FIG. 16 is a flowchart schematically illustrating the first embodiment (laminating type) of the image forming method.

FIG. 16 is a flowchart schematically illustrating the first embodiment (laminating type) of the image forming method. The arrow of (A) means a laminating step, (B) means a peeling step, (1) means an exposing step, (2) means a developing step, and (3) means a removing step. The meanings of the symbols of the layers and the components are the same as those shown in FIG. 12 to FIG. 15. The light-sensitive material is a multi-layered type shown in FIG. 7. The light-sensitive material is shown upside down in FIG. 16 for convenience. As is shown in FIG. 16, the laminating type of the first embodiment of the image forming method contains six orders of the steps.

The first order is (A)→(B)→(1)→(2)→(3):

(A) laminating the light-sensitive material (16a) on the image receiving material to form (16b);

(B) peeling the support of the light-sensitive material from the lamination (16b) to form (16c);

(1) imagewise exposing to light the peeled lamination (16c) to form (16f);

(2) developing the exposed lamination (16f) to form (16i); and (3) removing the unhardened area (or the hardened area) from the developed lamination (16i) to form (16j).

The second order is (A)→(1)→(B)→(2)→(3):

(A) laminating the light-sensitive material (16a) on the image receiving material to form (16b);

(1) imagewise exposing to light the lamination (16b) to form (16e);

(B) peeling the support of the light-sensitive material from the exposed lamination (16e) to form (16f);

(2) developing the peeled lamination (16f) to form (16i); and (3) removing the unhardened area (or the hardened area) from the developed lamination (16i) to form (16j).

The third order is (A)→(1)→(2)→(B)→(3):

(A) laminating the light-sensitive material (16a) on the image receiving material to form (16b);

(1) imagewise exposing to light the lamination (16b) to form (16e);

(2) developing the exposed lamination (16e) to form (16h);

(B) peeling the support of the light-sensitive material from the developed lamination (16h) to form (16i); and (3) removing the unhardened area (or the hardened area) from the peeled lamination (16i) to form (16j).

the fourth order is (1)→(A)→(B)→(2)→(3):

(1) imagewise exposing to light the light-sensitive material (16a) to form (16d);

(A) laminating the exposed light-sensitive material (16d) on the image receiving material to form (16e);

(B) peeling the support of the light-sensitive material from the lamination (16e) to form (16f);

(2) developing the lamination (16f) to form (16i); and (3) removing the unhardened area (or the hardened area) from the developed lamination (16i) to form (16j).

The fourth order is (1)→(A)→(B)→(2)→(3):

(1) imagewise exposing to light the light-sensitive material (16a) to form (16d);

(A) laminating the exposed light-sensitive material (16d) on the image receiving material to form (16e);

(B) peeling the support of the light-sensitive material from the lamination (16e) to form (16f);

(2) developing the lamination (16f) to form (16i); and (3) removing the unhardened area (or the hardened area) from the developed lamination (16i) to form (16j).

The fifth order is (1)→(A)→(2)→(B)→(3):

(1) imagewise exposing to light the light-sensitive material (16a) to form (16d);

(A) laminating the exposed light-sensitive material (16d) on the image receiving material to form (16e);

(2) developing the lamination (16e) to form (16h);

(B) peeling the support of the light-sensitive material from the developed lamination (16h) to form (16i); and (3) removing the unhardened area (or the hardened area) from the peeled lamination (16i) to form (16j).

The sixth order is (1)→(2)→(A)→(B)→(3):

(1) imagewise exposing to light the light-sensitive material (16a) to form (16d);

(2) developing the exposed light-sensitive material (16d) to form (16g);

(A) laminating the developed light-sensitive material (16g) on the image receiving material to form (16h);

(B) peeling the support of the light-sensitive material from the lamination (16h) to form (16i); and (3) removing the unhardened area (or the hardened area) from the peeled lamination (16i) to form (16j).

The above-mentioned orders can be classified into the group wherein the laminating step (A) is first conducted (the first, second and third orders) and the group wherein the exposing step (1) is first conducted (the fourth, fifth and sixth orders). The former group is preferred to the latter, since the former has an advantage of very easy adjustment and operation with respect to the setting of an image.

As is described in FIG. 16, the laminating type of the first embodiment of the invention comprises the steps of:

(A) laminating the light-sensitive material on the image-receiving material (the laminating step);

(B) peeling the support of the light-sensitive material from the lamination of the light-sensitive material and the image-receiving material (the peeling step);

(1) imagewise exposing to light the light-sensitive polymerizable layer (the exposing step);

(2) developing the light-sensitive polymerizable layer to harden the ethylenically unsaturated polymerizable compound or/and the cross-linkable polymer within the exposed area or, in the alternative, within the unexposed area (the developing step); and (3) placing the surface of the light-sensitive polymerizable layer in contact with the removing sheet and peeling the sheet to remove the unhardened area or, in the alternative, the hardened area with the sheet to obtain a hardened image whereby a color image is formed (the removing step), wherein the order is selected from:

(A)→(B)→(1)→(2)→(3);

(A)→(1)→(B)→(2)→(3);

(A)→(1)→(2)→(B)→(3);

(1)→(A)→(B)→(2)→(3);

(1)→(A)→(2)→(B)→(3); and (1)→(2)→(A)→(B)→(3).

An image is formed on the image receiving material according to the above-mentioned steps. The steps (A), (B) and (1) to (3) may be repeated using a light-sensitive material having another color to form a two-color image on the image receiving material. The steps (A), (B) and (1) to (3) may be further repeated with respect to the other colors to form a full color image on the image receiving material.

Figure 17:
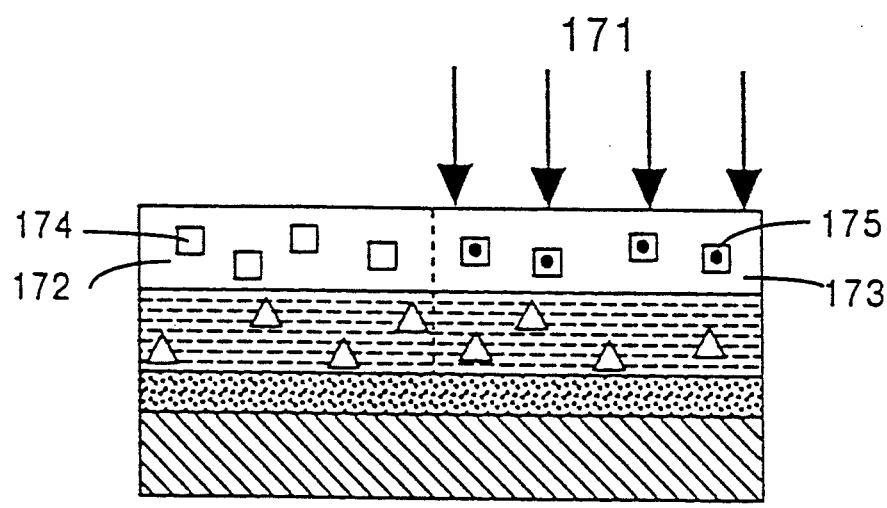
FIG. 17 is a sectional view schematically illustrating the exposing step of the second embodiment (transferring type) of the image forming method.

FIG. 17 is a sectional view schematically illustrating the exposing step of the second embodiment (transferring type) of the image forming method. A latent image of silver halide (175) is formed within the exposed area (173), where the light-sensitive layer is exposed to light (171). On the other hand, silver halide (174) within the unexposed area (172) is not substantially changed.

Figure 18:
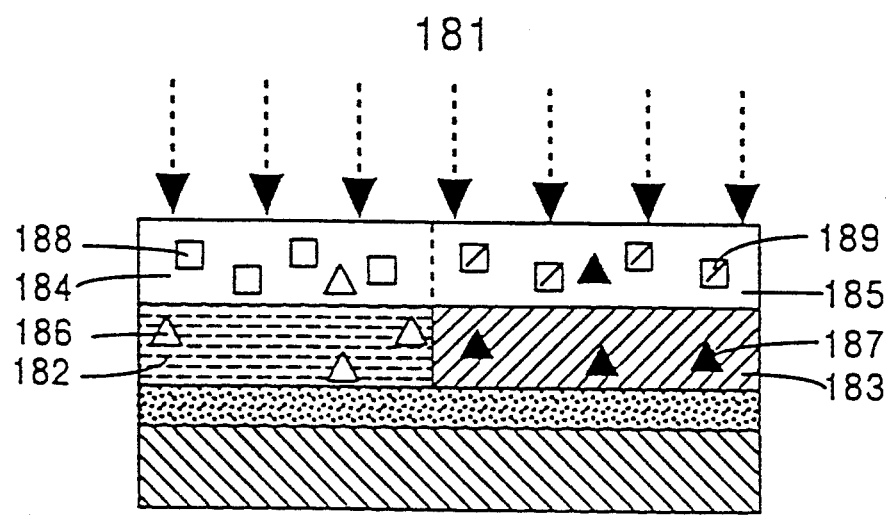
FIG. 18 is a sectional view schematically illustrating the developing step of the second embodiment (transferring type) of the image forming method.

FIG. 18 is a sectional view schematically illustrating the developing step of the second embodiment (transferring type) of the image forming method. When the light-sensitive material is heated (181), a reducing agent is moved from a polymerizable layer (182 and 183) to a light-sensitive layer (184 and 185). The reducing agent develops the latent image of silver halide within the exposed area of the light-sensitive layer (185). A silver image (189) is formed from the developed silver halide, and the reducing agent is simultaneously oxidized to form an oxidation radical (187). The oxidation radical of the reducing agent (187) is moved from the exposed area of the light-sensitive layer (185) to the exposed area of the polymerizable layer (183). An ethylenically unsaturated polymerizable compound or/and a cross-linkable polymer is hardened by the function of the radical. Thus, the hardened area (183) is formed. On the other hand, the reducing agent (186) contained in the unexposed area of the polymerizable layer and silver halide (188) contained in the light-sensitive layer are not substantially changed. Thus, the unexposed area of the polymerizable layer (182) is not hardened.

Figure 19:
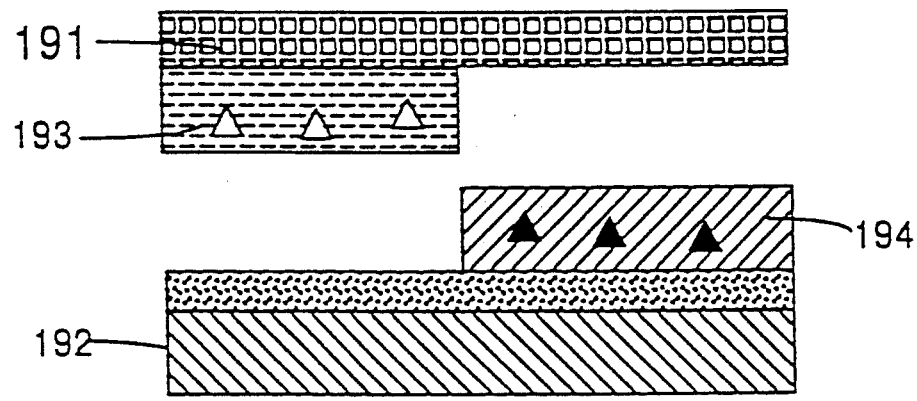
FIG. 19 is a sectional view schematically illustrating the removing step of the second embodiment (transferring type) of the image forming method.

FIG. 19 is a sectional view schematically illustrating the removing step of the second embodiment (transferring type) of the image forming method. A removing sheet (191) is placed in contact with the light-sensitive material (192) and peeled from the material. The unhardened area (193) is transferred to the removing sheet. Thus the adhesive layer is imagewise exposed. The hardened area (194) remains over the adhesive layer in the light-sensitive material. The light-sensitive layer is peeled before the removing step, or is removed together the unhardened area of the polymerizable layer with the sheet at the removing step.

Figure 20:
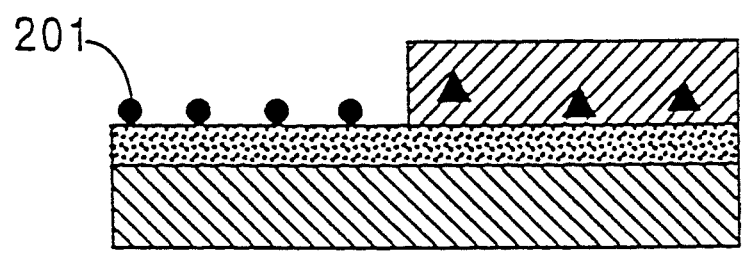
FIG. 20 is a sectional view schematically illustrating the toning step of the second embodiment (transferring type) of the image forming method.

FIG. 20 is a sectional view schematically illustrating the toning step of the second embodiment (transferring type) of the image forming method. Color toner (201) is applied to the surface of the light-sensitive material. Thus the toner is attached to the exposed surface of the adhesive layer to form a toner image.

Figure 21:
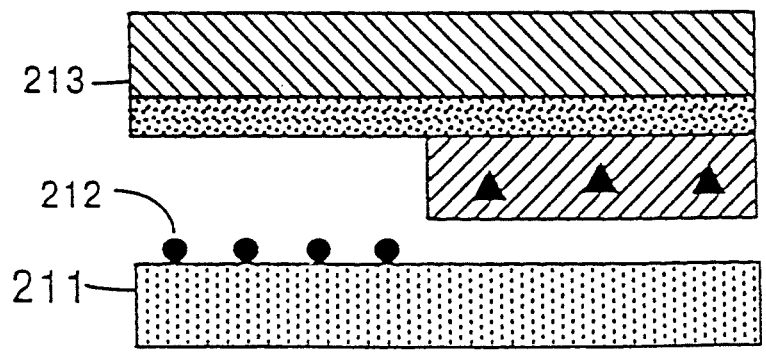
FIG. 21 is a sectional view schematically illustrating the transferring step of the second embodiment (transferring type) of the image forming method.

FIG. 21 is a sectional view schematically illustrating the transferring step of the second embodiment (transferring type) of the image forming method. FIG. 21 shows an image receiving material (211) and a light-sensitive material (213) just after the image is transferred. The light-sensitive material (213) is placed in contact with the image receiving material (211). Thus, the toner image (212) is transferred from the light-sensitive material to the image receiving material.

As is described in FIG. 17 to FIG. 21, the transferring type of the second embodiment of the invention comprises the steps of:

(1) imagewise exposing to light the light-sensitive polymerizable layer (the exposing step shown in FIG. 17);

(2) developing the light-sensitive polymerizable layer to harden the ethylenically unsaturated polymerizable compound or/and the cross-linkable polymer within the exposed area or, in the alternative, within the unexposed area (the developing step shown in FIG. 18);

(3) placing the surface of the light-sensitive polymerizable layer in contact with the removing sheet and peeling the sheet to remove the unhardened area with the sheet whereby the adhesive layer is imagewise exposed (the removing step shown in FIG. 19);

(4) applying color tone ron the surface of the adhesive layer whereby a toner image is formed (the toning step shown in FIG. 20); and then (5) placing the light-sensitive material in contact with the image receiving material whereby the toner image is transferred to the image receiving material (the transferring step shown in FIG. 21).

An image is formed on the image receiving material according to the above-mentioned steps. The steps (1) to (5) may be repeated using a toner having another color to form a two-color image on the image receiving material. The steps (1) to (5) may be further repeated with respect to the other colors to form a full color image on the image receiving material.

Figure 22:
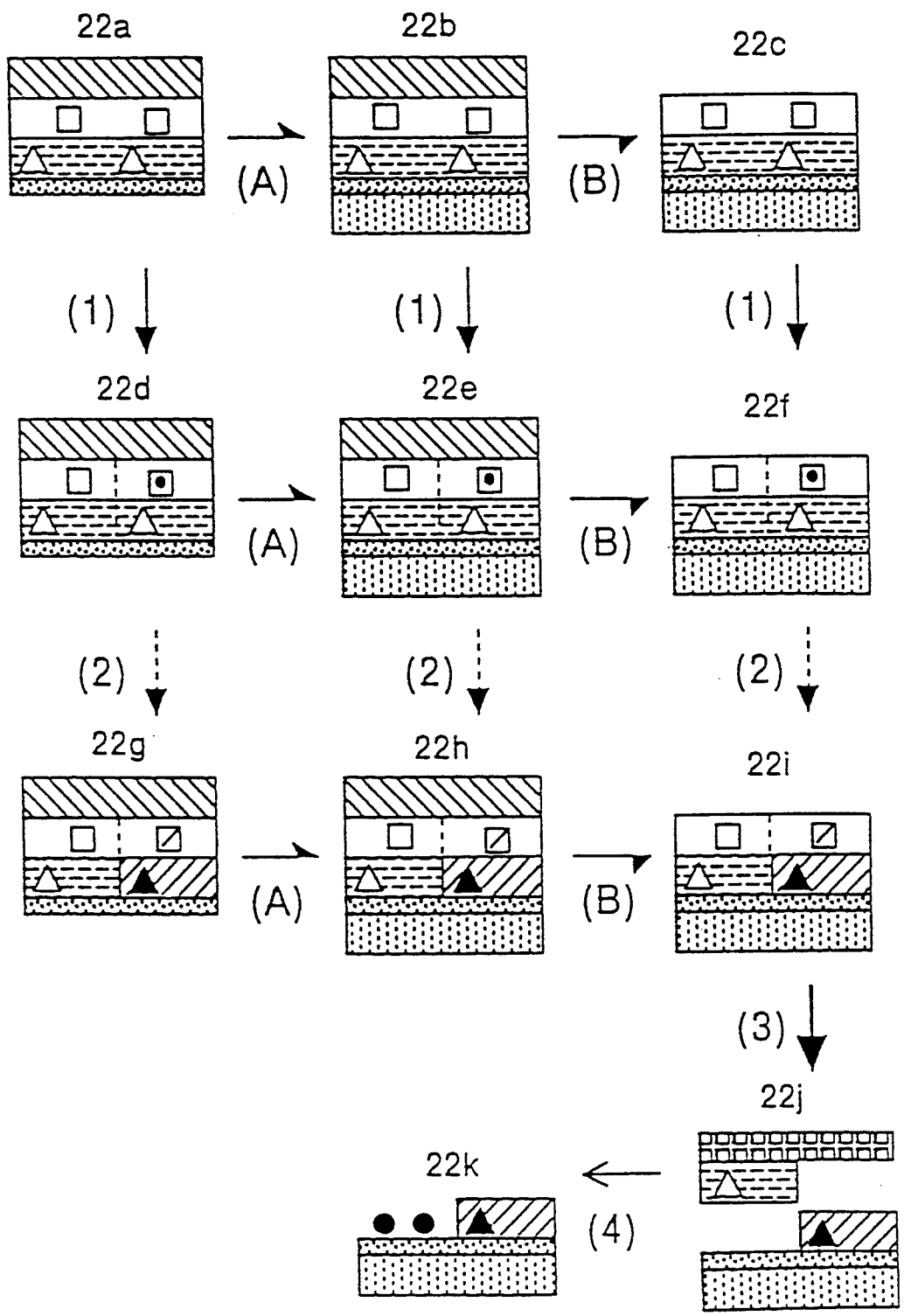
FIG. 22 is a flowchart schematically illustrating the second embodiment (laminating type) of the image forming method.

FIG. 22 is a flowchart schematically illustrating the second embodiment (laminating type) of the image forming method. The arrow of (A) means a laminating step, (B) means a peeling step, (1) means an exposing step, (2) means a developing step, (3) means a removing step, and (4) means a toning step. The meanings of the symbols of the layers and the components are the same as those shown in FIG. 17 to FIG. 21. The light-sensitive material is a multi-layered type shown in FIG. 9. The light-sensitive material is shown upside down in FIG. 16 for convenience. As is shown in FIG. 22, the laminating type of the second embodiment of the image forming method contains six orders of the steps. The details of the orders are the same as those described in the lamination type of the first embodiment.

The six orders can be classified into the group wherein the laminating step (A) is first conducted (the first, second and third orders) and the group wherein the exposing step (1) is first conducted (the fourth, fifth and sixth orders). The former group is preferred to the latter for the reason mentioned in the laminating type of the first embodiment.

As is described in FIG. 22, the laminating type of the second embodiment of the invention comprises the steps of:

(A) laminating the light-sensitive material on the image-receiving material (the laminating step);

(B) peeling the support of the light-sensitive material from the lamination of the light-sensitive material and the image-receiving material (the peeling step);

(1) imagewise exposing to light the light-sensitive polymerizable layer (the exposing step);

(2) developing the light-sensitive polymerizable layer to harden the ethylenically unsaturated polymerizable compound or/and the cross-linkable polymer within the exposed area or, in the alternative, within the unexposed area (the developing step);

(3) placing the surface of the light-sensitive polymerizable layer in contact with the removing sheet and peeling the sheet to remove the unhardened area with the sheet whereby the adhesive layer is imagewise exposed (the removing step); and (4) applying color tone ron the surface of the adhesive layer whereby a toner image is formed (the toning step), wherein the order is selected from:

(A)→(B)→(1)→(2)→(3)→(4);

(A)→(1)→(B)→(2)→(3)→(4);

(A)→(1)→(2)→(B)→(3)→(4);

(1)→(A)→(B)→(2)→(3)→(4);

(1)→(A)→(2)→(B)→(3)→(4); and (1)→(2)→(A)→(B)→(3)→(4).

An image is formed on the image receiving material according to the above-mentioned steps. The steps (A), (B) and (1) to (4) may be repeated using a toner having another color to form a two-color image on the image receiving material. The steps (A), (B) and (1) to (4) may be further repeated with respect to the other colors to form a full color image on the image receiving material.

Figure 23:
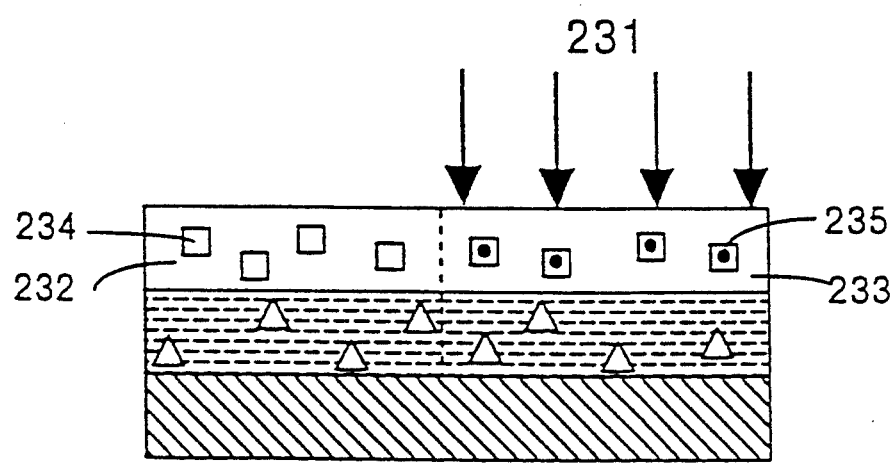
FIG. 23 is a sectional view schematically illustrating the exposing step of the third embodiment (transferring type) of the image forming method.

FIG. 23 is a sectional view schematically illustrating the exposing step of the third embodiment (transferring type) of the image forming method. A latent image of silver halide (235) is formed within the exposed area (233), where the light-sensitive layer is exposed to light (231). On the other hand, silver halide (234) within the unexposed area (232) is not substantially changed.

Figure 24:
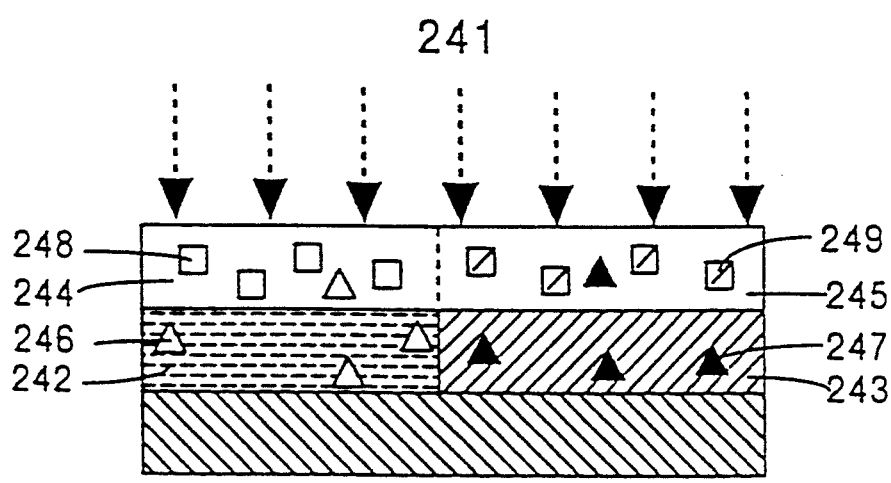
FIG. 24 is a sectional view schematically illustrating the developing step of the third embodiment (transferring type) of the image forming method.

FIG. 24 is a sectional view schematically illustrating the developing step of the third embodiment (transferring type) of the image forming method. When the light-sensitive material is heated (241), a reducing agent is moved from a polymerizable layer (242 and 243) to a light-sensitive layer (244 and 245). The reducing agent develops the latent image of silver halide within the exposed area of the light-sensitive layer (245). A silver image (249) is formed from the developed silver halide, and the reducing agent is simultaneously oxidized to form an oxidation radical (247). The oxidation radical of the reducing agent (247) is moved from the exposed area of the light-sensitive layer (245) to the exposed area of the polymerizable layer (243). An ethylenically unsaturated polymerizable compound or/and a cross-linkable polymer is hardened by the function of the radical. Thus, the hardened area (243) is formed. On the other hand, the reducing agent (246) contained in the unexposed area of the polymerizable layer and silver halide (248) contained in the light-sensitive layer are not substantially changed. Thus, the unexposed area of the polymerizable layer (242) is not hardened.

Figure 25:
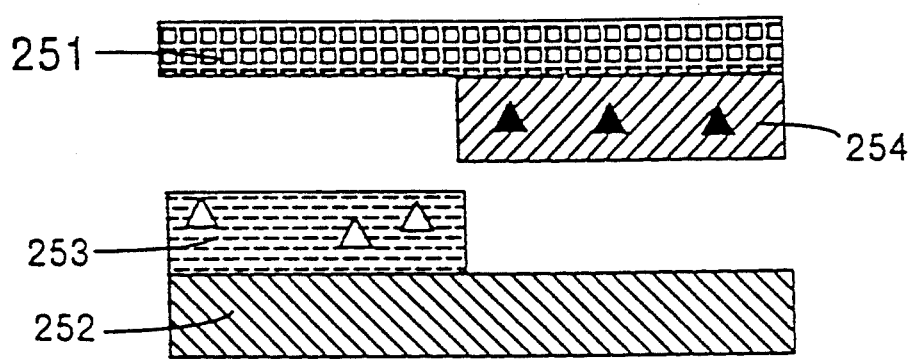
FIG. 25 is a sectional view schematically illustrating the removing step of the third embodiment (transferring type) of the image forming method.

FIG. 25 is a sectional view schematically illustrating the removing step of the third embodiment (transferring type) of the image forming method. A removing sheet (251) is placed in contact with the light-sensitive material (252) and peeled from the material. The hardened area (254) is transferred to the removing sheet. Thus the adhesive unhardened area (253) is imagewise formed. The light-sensitive layer is peeled before the removing step, or is removed together the unhardened area of the polymerizable layer with the sheet at the removing step.

Figure 26:
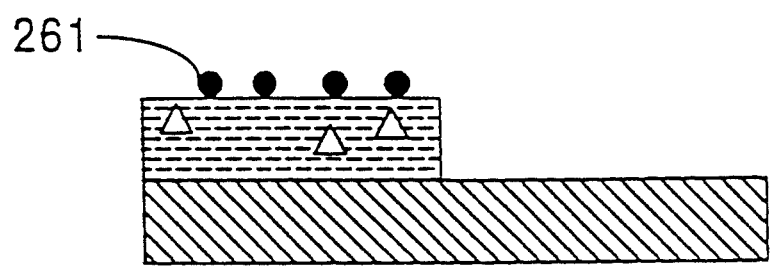
FIG. 26 is a sectional view schematically illustrating the toning step of the third embodiment (transferring type) of the image forming method.

FIG. 26 is a sectional view schematically illustrating the toning step of the third embodiment (transferring type) of the image forming method. Color toner (261) is applied to the surface of the light-sensitive material. Thus the toner is attached to the surface of the adhesive unhardened area to form a toner image.

Figure 27:
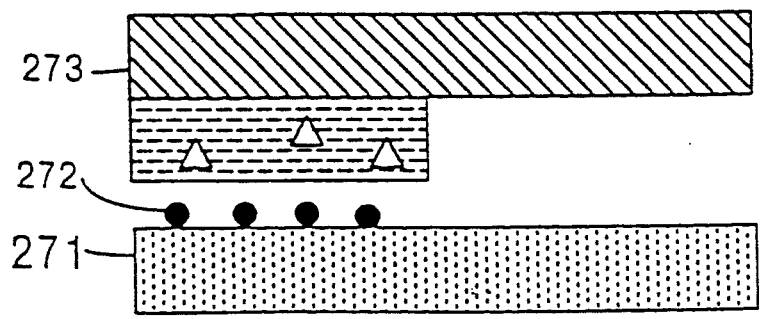
FIG. 27 is a sectional view schematically illustrating the transferring step of the third embodiment (transferring type) of the image forming method.

FIG. 27 is a sectional view schematically illustrating the transferring step of the third embodiment (transferring type) of the image forming method. FIG. 27 shows an image receiving material (271) and a light-sensitive material (273) just after the image is transferred. The light-sensitive material (273) is placed in contact with the image receiving material (271). Thus, the toner image (272) is transferred from the light-sensitive material to the image receiving material.

As is described in FIG. 23 to FIG. 27, the transferring type of the third embodiment of the invention comprises the steps of:

(1) imagewise exposing to light the light-sensitive polymerizable layer (the exposing step shown in FIG. 23);

(2) developing the light-sensitive polymerizable layer to harden the ethylenically unsaturated polymerizable compound or/and the cross-linkable polymer within the exposed area or, in the alternative, within the unexposed area (the developing step shown in FIG. 24);

(3) placing the surface of the light-sensitive polymerizable layer in contact with the removing sheet and peeling the sheet to remove the hardened area with the sheet whereby the adhesive unhardened area is imagewise formed (the removing step shown in FIG. 25);

(4) applying color toner on the surface of the adhesive unhardened area whereby a toner image is formed (the toning step shown in FIG. 26); and then (5) placing the light-sensitive material in contact with the image receiving material whereby the toner image is transferred to the image receiving material (the transferring step shown in FIG. 27)

An image is formed on the image receiving material according to the above-mentioned steps. The steps (1) to (5) may be repeated using a toner having another color to form a two-color image on the image receiving material. The steps (1) to (5) may be further repeated with respect to the other colors to form a full color image on the image receiving material.

Figure 28:
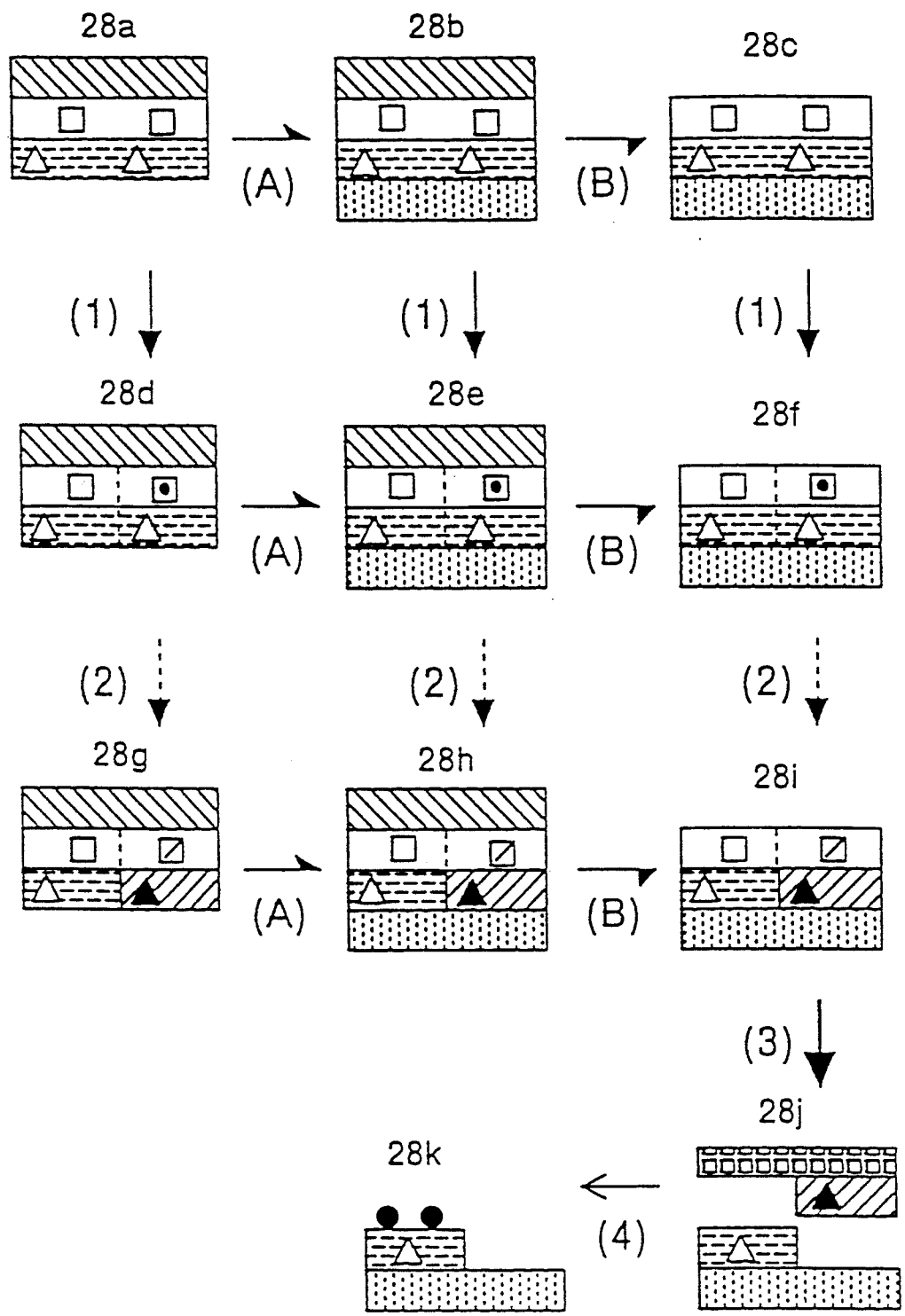
FIG. 28 is a flowchart schematically illustrating the third embodiment (laminating type) of the image forming method.

FIG. 28 is a flowchart schematically illustrating the third embodiment (laminating type) of the image forming method. The arrow of (A) means a laminating step, (B) means a peeling step, (1) means an exposing step, (2) means a developing step, (3) means a removing step, and (4) means a toning step. The meanings of the symbols of the layers and the components are the same as those shown in FIG. 23 to FIG. 27. The light-sensitive material is a multi-layered type shown in FIG. 11. The light-sensitive material is shown upside down in FIG. 28 for convenience. As is shown in FIG. 28, the laminating type of the third embodiment of the image forming method contains six orders of the steps. The details of the orders are the same as those described in the lamination type of the first embodiment.

The six orders can be classified into the group wherein the laminating step (A) is first conducted (the first, second and third orders) and the group wherein the exposing step (1) is first conducted (the fourth, fifth and sixth orders). The former group is preferred to the latter for the reason mentioned in the lamination type of the first embodiment.

As is described in FIG. 28, the laminating type of the third embodiment of the invention comprises the steps of:

(A) laminating the light-sensitive material on the image-receiving material (the laminating step);

(B) peeling the support of the light-sensitive material from the lamination of the light-sensitive material and the image-receiving material (the peeling step);

(1) imagewise exposing to light the light-sensitive polymerizable layer (the exposing step);

(2) developing the light-sensitive polymerizable layer to harden the ethylenically unsaturated polymerizable compound or/and the cross-linkable polymer within the exposed area or, in the alternative, within the unexposed area (the developing step);

(3) placing the surface of the light-sensitive polymerizable layer in contact with the removing sheet and peeling the sheet to remove the hardened area with the sheet whereby the adhesive unhardened area is imagewise formed (the removing step); and (4) applying color toner on the surface of the adhesive unhardened area whereby a toner image is formed (the toning step), wherein the order is selected from:

(A)→(B)→(1)→(2)→(3)→(4);

(A)→(1)→(B)→(2)→(3)→(4);

(A)→(1)→(2)→(B)→(3)→(4);

(1)→(A)→(B)→(2)→(3)→(4);

(1)→(A)→(2)→(B)→(3)→(4); and (1)→(2)→(A)→(B)→(3)→(4).

An image is formed on the image receiving material according to the above-mentioned steps. The steps (A), (B) and (1) to (4) may be repeated using a toner having another color to form a two-color image on the image receiving material. The steps (A), (B) and (1) to (4) may be further repeated with respect to the other colors to form a full color image on the image receiving material.

The above are the representative embodiments of the image forming method. In the image forming method of the present invention, optional steps may be added to the above-described steps.

When a multi-layered light-sensitive material is used, the light-sensitive layer and the layer provided on or above the polymerizable layer should be removed before the removing step (after the developing step) or simultaneously with the removing step. The layers may be peeled to be removed. Further, the layers may be dissolved in or swelled with a solvent which does not dissolve the polymerizable layer. Furthermore, the layers may be removed together the unhardened area of the polymerizable layer with a solvent.

The single-color or multicolor image formed on the image receiving material may be further transferred to another (secondary) image receiving material.

In the present invention, the image is reversed by the transferring step. The reversed image is appropriate in the case that the final color image is formed on a transparent support. On the other hand, the final image should be an erect image on the case that the image is formed on an opaque support. The reversed image can be changed to the erect image by a reversal exposure or an additional transferring step. The relation between the reversed image and the erect image should be noted when the method further contains the above-mentioned additional transferring step.

The other optional steps may be added to the method. Examples of the optional steps include a step of removing optional layers (e.g., an intermediate layer, a backing layer), a step of dull-finishing the surface of the image receiving material on which an image has been formed, and a step of adding a matting agent to the image receiving material.

The main steps of the present invention are described below in more detail.

Exposing Step

The light-sensitive material can be imagewise exposed to light from the surface of the layers (the reverse side of the support). The material can also be imagewise exposed to light from the side of the support. Between the light source and the light-sensitive polymerizable layer (or the light-sensitive layer of a multi-layered light-sensitive material), another layer, the support or an image receiving material may intervene so long as the intervening substances are transparent not to disturb the sensitivity of the light-sensitive polymerizable layer.

Examples of the exposing methods include a reflective exposure, a contact exposure through a transparent positive and a scanning exposure. The reflective exposure uses a xenon lamp, a tungsten lamp or a fluorescent lamp as the light source. The scanning exposure uses a laser beam or a light emission diode as the light source. The present invention is characterized in that an image is formed from the light-sensitive material having a sensitivity to a scanning light. Therefore, the method of the present invention is particularly advantageous to the scanning exposure.

Examples of the laser beams include a helium-neon laser, a helium-cadmium laser, an argon ion laser, a krypton ion laser, a YAG laser, a ruby laser, a nitrogen laser, a dye laser, an excimer laser, a semiconductor (e.g., GaAs/GaAlAs, InGaAsP) laser, an alexandrite laser, a copper vapor laser and an erbium laser. A light emission diode and a liquid crystal shutter are also available as the light source of the scanning exposure. The light emission diode and the liquid crystal shutter include a light emission diode array and a liquid crystal shutter array, which are used as the light-source of a line printer.

The wavelength of the light corresponds to the spectral sensitivity of silver halide. Near ultraviolet, visible and near infrared regions are available. The amount of the exposure is generally determined by a sensitivity of the silver halide emulsion. The amount is usually in the range of 0.01 to 10,000 ergs/cm$^2$. At the exposing step, a latent image of silver halide is formed within the exposed area. [Developing Step The light-sensitive material is preferably developed by heating. The developing step can be conducted simultaneously with the exposing step.

The exposed light-sensitive material can be directly or indirectly heated by the known heating means. The heat development can be conducted b placing the light-sensitive material in contact with a heated material (e.g., heated plate roller), heating the light-sensitive material by a radiation heat of an infrared rays lamp, placing the light-sensitive material in a heated zone, or passing the light-sensitive material through a heated zone. The surface of the light-sensitive material may be covered to prevent the influence of the air on the developing reaction. The heating temperature and the heating time are determined by the characteristics of the light-sensitive material. The heating temperature is preferably in the range of 70° to 200° C. The heating time is preferably in the range of 1 to 180 seconds.

The light-sensitive material can also be developed by a wet development process using a developing solution. In the second, fourth and sixth embodiments of the present invention, the developing solution (preferably a condensed solution) can be coated between the light-sensitive material and the image-receiving material.

At the developing step, the latent image of silver halide is developed, and an oxidation product of the reducing agent is formed within the exposed area. In the case that the oxidation product has a function of accelerating a polymerization reaction, an ethylenically unsaturated polymerizable compound or/and a cross-linkable polymer is hardened within the exposed area. In the case that the oxidation product has a function of inhibiting a polymerization reaction, an ethylenically unsaturated polymerizable compound or/and a cross-linkable polymer is hardened within the unexposed area.

In the system wherein the unexposed area is hardened, a thermal polymerization initiator or a photopolymerization initiator is preferably contained in the light-sensitive material. When the photopolymerization initiator is used, the light-sensitive material is uniformly exposed to light after the developing step.

Removing Step

After the developing step, the light-sensitive polymerizable layer (the polymerizable layer of the multi-layered light-sensitive material) is hardened within the exposed area or, in the alternative, within the unexposed area. As a result, the adhesion between the layer and the support is changed. When a removing sheet is placed in contact with the light-sensitive material, the hardened area, or in the alternative, the unhardened area is attached to the removing sheet. Whether the hardened area of the unhardened area is attached to the removing sheet is determined by (a) the adhesion between the unhardened area and the support, (b) the adhesion between the unhardened area and the sheet, (c) the adhesion between the hardened area and the support and (d) the adhesion between the hardened area and the sheet. The hardened area is removed with the sheet under conditions that (a)>(b) and (c)<(d). On the other hand, the unhardened area is removed with the sheet under conditions that (a)<(b) and (c)>(d). These conditions are determined by the nature and amount of the polymerizable compound, the nature of the binder of the light-sensitive polymerizable layer and the nature and mount of the other components. The conditions are also determined by the circumstances of the removing step (e.g., temperature, time, pressure, humidity).

Thus, a hardened or unhardened image is formed. In the first embodiment, a color image is formed on the light-sensitive material. In the second embodiment, the adhesive layer. Color toner is applied to the adhesive layer. In the third embodiment, the adhesive unhardened area is imagewise formed. Color toner is applied to the adhesive unhardened area.

The removing sheet can be made of an art paper, a coated paper, a printing paper or a plastic sheet. A resin binder, a plasticizer, a surfactant or a matting agent may be coated on the paper or the sheet. The removing sheet can be prepared in the same manner in preparation of the image receiving material described below.

Transferring Step

At the transferring step of the first embodiment, the surface of the imagewise hardened light-sensitive material is placed in contact with an image receiving material to transfer the color image of the hardened area to the image receiving material. The transferring step is conducted by pressure or/and heat. A layer (e.g., an undercoating layer) other than the light-sensitive polymerizable layer (the polymerizable layer of the multi-layered light-sensitive material) may be transferred to the image receiving material together the hardened area. The conditions of the transferring step such as temperature and pressure are determined by the characteristics of the light-sensitive layer and the image receiving material. The temperature is preferably in the range of 10° to 200° C., and the pressure is preferably in the range of 0 to 2,000 kg/cm².

At the transferring step of the second and third embodiments, the color toner on the surface of the light-sensitive material is placed in contact with an image receiving material to transfer the toner to the image receiving material. The transferring step is conducted by pressure or/and heat. A layer (e.g., an adhesive layer, a light-sensitive polymerizable layer, an undercoating layer) may be transferred to the image receiving material together the color toner. The conditions of the transferring step such as temperature and pressure are determined by the characteristics of the color toner, the adhesive layer, the light-sensitive layer and the image receiving material. The temperature is preferably in the range of 10° to 200° C., and the pressure is preferably in the range of 0 to 2,000 kg/cm².

The image receiving material can be made of an art paper, a coated paper, a printing paper and or a plastic sheet. A resin binder, a plasticizer, a surfactant or a matting agent may be coated on the paper or the sheet.

Toning Step

At the toning step of the second embodiment, color toner is applied on the surface of the adhesive layer, which has been imagewise exposed by removing the unhardened area. In this case, the conditions of the developing step should be so adjusted that the adhesion of the hardened area is sufficiently reduced.

At the toning step of the third embodiment, color toner is applied on the surface of the adhesive unhardened area formed by removing the hardened area. A surface having no adhesion is exposed under the removed hardened area.

The toning step is conducted by spreading the color toner on the surface of the adhesive layer or the light-sensitive polymerizable layer and rubbing the surface with a cloth or a sponge. An automatic toning machine (e.g., 2900 type of Du Pont de Nemours & Co.) is available.

The toner is attached to the adhesive surface to form an image. The toner is preferably in the form of powder. The average particle size of the powder toner is preferably in the range of 0.1 to 50 μm. The powder can be made from a colorant (pigment or dye) or a mixture of the colorant with a resin binder. The mixture may further contain an optional component. Various known organic or inorganic pigments or dyes are available as the colorant. The pigments and dyes are listed in the color index. The colorant contained in the light-sensitive material (described at the item of [Colorant]) is also available.

Various known natural or synthetic polymers are available as the resin binder of the color toner. Examples of the resin binders include polyvinyl chloride, cellulose acetate, cellulose acetate butylate, polystyrene, polymethyl methacrylate, methyl cellulose and carboxymethyl cellulose. The toner may further contain optional components, such as a plasticizer, a monomer, a surface active agent, an antistatic agent, a dispersing agent and a surfactant. The color toner is described in U.S. Pat. Nos. 3,620,726, 4,304,843, 4,397,941, 4,461,822, 4,546,072 and 4,215,193, Japanese Patent Publications No. 1(1989) 36611 and No. 49(1974)-7750 and Japanese Patent Provisional Publication No. 59(1984)-104665.

Laminating Step

At the laminating step, the light-sensitive material is laminated on an image receiving material.

The laminating step is conducted by pressure or/and heat. For example, the light-sensitive material is placed in contact with the image receiving material, and then passed through rubber rollers to form lamination. The other known laminating methods are also available.

The image receiving material used at the laminating step preferably has a thickness in the range of 5 to 50 $\mu$m. whereby the toner image is transferred to the image receiving material. The image receiving material can be made of an art paper, a coated paper, a printing paper and or a plastic sheet. A resin binder, a plasticizer, a surfactant or a matting agent may be coated on the paper or the sheet.

In preparation of the light-sensitive material, the light-sensitive material may be laminated on the image receiving material. The embodiment using a previously prepared lamination is also included in the scope of the present invention.

The components and the elements of the light-sensitive material used in the image forming method of the present invention are described below in more detail.

Silver Halide

Silver halide is silver chloride, silver bromide, silver iodide, silver chlorobromide, silver chloriodide, silver iodobromide or silver chloroiodobromide in the form of grains.

Various crystal forms of silver halide grains are available. Examples of the grains include a regular crystal form such as hexahedron, octahedron or tetradecahedron, an irregular form such as spherical form or tubular form, a form having crystalline defect such as a twinning plane, and a mixed form thereof.

The silver halide grains may be extremely small grains having a grain diameter (diameter of projected area) of less than 0.01 $\mu$m, or may be relatively large grains having a diameter of more 10 $\mu$m. The silver halide emulsion may be a polydispersed emulsion or a monodispersed emulsion. The monodispersed emulsion is described in U.S. Pat. Nos. 3,574,628 and 3,655,394 and U.K. Patent No. 1,413,748.

A tubular silver halide emulsion having an aspect ratio of not less than 5 is also available. The tubular silver halide grains can be easily prepared by processes described in Gutoff, "Photographic Science and Engineering, Vol. 14, pp. 248-257 (1970)", U.S. Pat. Nos. 4,434,226, 4,414,310, 4,433,048 and 4,439,520, and U.K. Patent No. 2,112,157.

With respect to the crystal structure of the silver halide grains, the individual grains may have a homogeneous halogen composition or a heterogeneous halogen composition in which the composition varies from the outer surface portion to the inside portion. The grains may have a multi-layered structure. Further, the silver halide grains may be bonded with other silver halide grains having different halogen composition through epitaxial bonding. The grains may be bonded with compounds other than the silver halide such as silver rhodanate and lead oxide.

Various substances in the form of salt can be added to the silver halide according to a conventional process at the grain formation or after the grain formation. Examples of the substances include copper, thallium, lead, cadmium, zinc, a chalcogen such as sulfur, selenium and tellurium, gold, and a group III noble metal such as rhodium, iridium, iron, platinum and palladium. The conventional process is described in U.S. Pat. Nos. 1,195,432, 1,191,933, 2,448,060, 2,628,167, 2,950,972, 3,488,709, 3,737,313, 3,772,031, 4,269,927 and "Research Disclosure" (RD), No. 13,452 (June, 1975).

In the case that the light-sensitive material is exposed to light in a short time and at a high illumination, iridium ion is preferably added to the silver halide in an amount of $10^{-8}$ to $10^{-3}$ mole, and more preferably in an amount of $10^{-7}$ to $10^{-5}$ mole based on 1 mole of silver halide.

Two or more kinds of silver halide grains which differ in halogen composition, crystal habit, grain size, and/or other features from each other can be used in combination.

The silver halide is preferably used in the form of an emulsion. The silver halide emulsion can be prepared by a known process, which is described in "Research Disclosure" (RD), No. 17,643, pp. 22-23 (December, 1978), (Emulsion preparation and types); and "Research Disclosure ", No. 18,716, p. 648, (November, 1979).

The silver halide emulsion is generally used after subjecting it to physical ripening, chemical ripening and spectral sensitization. Various additives are used in those stages. The additives are described in "Research Disclosure", No. 17,643 and No. 18,716. The chemical sensitizing agent is described in No. 17,643 (p. 23) and No. 18,716 (p. 648, right side). The spectral sensitizing agent is described in No. 17,643 (pp. 23-24) and No. 18,716 (p. 648, right side). The supersensitizing agent is described in No. 18,716 (p. 649, right side). Other additives are also described in "Research Disclosure". For example, a sensitivity-increasing agent is described in No. 18,716 (p. 648, right side), and an anti-fogging agent and a stabilizer are described in No. 17,643 (pp. 24-25) and No. 18,716 (p. 649, right side), respectively.

It is preferred to use silver halide grains having a relatively low fogging value.

The silver halide emulsion usually is a negative type. A reversal silver halide emulsion which directly forms a positive image is also available.

Reducing Agent

The reducing agent has a function of reducing the silver halide and/or a function of accelerating (or inhibiting) polymerization of the polymerizable compound or the cross-linkable polymer. There are known various reducing agents having the these functions. Examples of the reducing agents include hydroquinones, catechols, p-aminophenols, p-phenylenediamines, 3-pyrazolidones, 3-aminopyrazoles, 4-amino-5-pyrazolones, 5- aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind or amount of the above reducing agent, the polymerizable compound can be polymerized within the area where a latent image of the silver halide has been formed or, in the alternative, within the area where a latent image of the silver halide has not been formed. For example, the following system (A), (B) or (C) may be employed.

(A) When the reducing agent develops silver halide, the reducing agent itself is oxidized to form an oxidation product. The oxidation product is decomposed in the layer to form a radical. Thus a polymerization reaction proceeds within the area where the latent image of silver halide has been formed. In this system, hydrazines are used as the reducing agent singly or in combination with other reducing agent.

(B) In the case that the oxidation product has a function of inhibiting the polymerization, the polymerization is inhibited within the area where the latent image of silver halide has been formed. The polymerization is caused by a polymerization initiator within the area where the latent image of silver halide has not been formed. In this system, 1-phenyl-3-pyrazolidones are preferably used as the reducing agent.

(C) In the case that the reducing agent itself has a function of inhibiting the polymerization and the oxidation product has no or weak inhibiting function, the polymerization is inhibited within the area where the latent image of silver halide has not been formed. The polymerization is caused by a polymerization initiator within the area where the latent image of silver halide has been formed. In this system, hydroquinones are preferably used as the reducing agent.

In the systems (B) and (C), a polymerization initiator (a thermal polymerization initiator or a photopolymerization initiator) is contained in a layer of the light-sensitive material. The systems (B) and (C) are described in U.S. Pat. No. 4,649,098 and European Patent Publication No. 0202490.

The reducing agents (including compounds referred to as developing agent or hydrazine derivative) are described in Japanese Patent Provisional Publications No. 61(1986)-183640, No. 61(1986)-183535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, and Japanese Patent Applications No. 63(1988)-97379, No. 63(1988)-296774, No. 63(1988)-296775, No. 1(1989)-27175, No. 1(1989)-54101 and No. 1(1989)-91162. The reducing agents are also described in T. James, "The Theory of the Photographic Process", 4th edition, pp. 291-334 (1977), "Research Disclosure", Vol. 170, No. 17029, pp. 9-15 (June, 1978), and "Research Disclosure", Vol. 176, No. 17643, pp. 22-31 (December, 1978). Further, there can be also employed a reducing agent precursor capable of releasing a reducing agent under heating or in contact with a base. Also in the light-sensitive material, various reducing agents and reducing agent precursors described in the above publications, applications and literatures can be effectively used. Thus, "the reducing agent" in the present specification means to include all the reducing agents and reducing agent precursors described in the above publications.

When the reducing agent is basic, that is, it forms a salt with an acid, the reducing agent can be used in the form of a salt with an acid. The reducing agents can be used singly or in combination. In the case that two or more reducing agents are used in combination, certain interactions between those reducing agents may be expected. One of the interactions is for an acceleration of reduction of silver halide (and/or an organic silver salt) through so-called superadditivity. The other interaction is for a chain reaction in which an oxidant of one reducing agent formed by a reduction of silver halide (and/or an organic silver salt) induced or inhibits the polymerization of the polymerizable compound by oxidation-reduction reaction with other reducing agent. Both interactions may occur simultaneously. Thus, it is difficult to determine which of the interactions has occurred in practical use.

The reducing agent is used in an amount of 0.1 to 10 mole, more preferably 0.5 to 5 mole based on 1 mole of silver halide.

Examples of the reducing agents are described below.

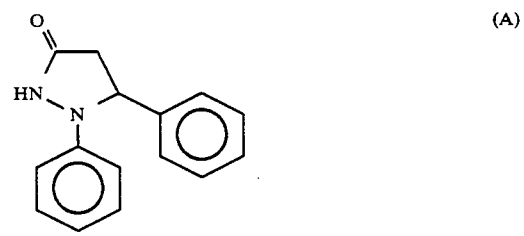

(A)

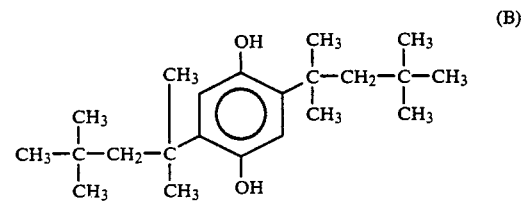

(B)

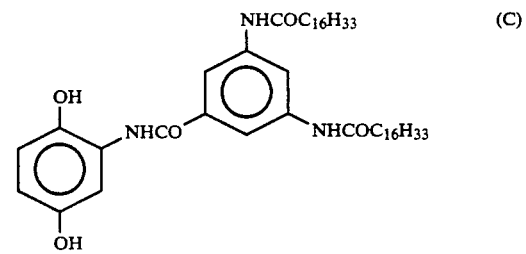

(C)

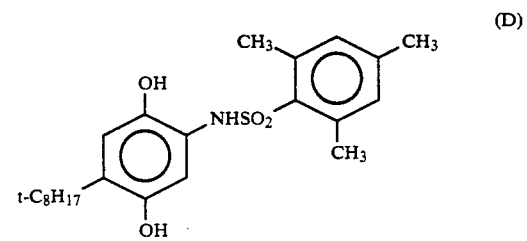

(D)

(E)

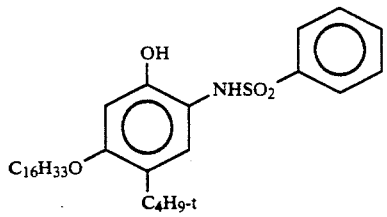

(F)

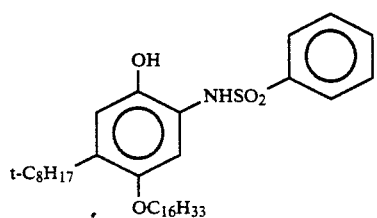

(G)

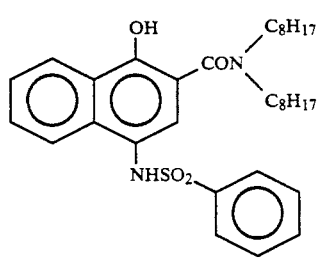

(H)

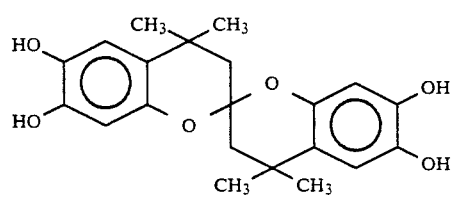

(I)

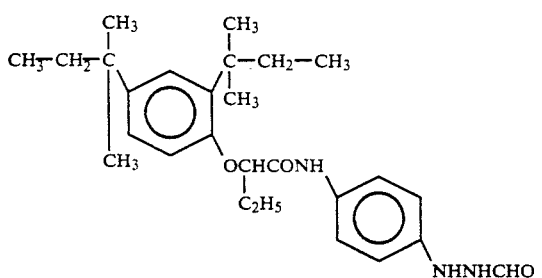

(J)

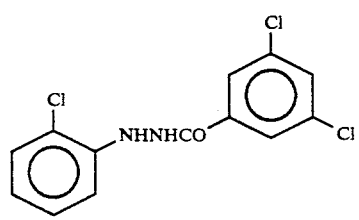

(K)

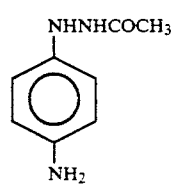

(L)

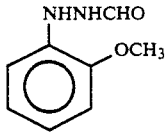

Polymerizable Compound and Cross-Linkable Polymer

The polymerizable compound used in the present invention has an ethylenic unsaturated group.

Examples of the compounds having an ethylenic unsaturated group include acrylic acids, salts of acrylic acids, acrylic esters, acrylamides, methacrylic acids, salts of methacrylic acids, methacrylic esters, methacrylamides, maleic anhydride, maleic ester, itaconic esters, styrenes, vinyl ethers, vinyl esters, N-vinyl heterocyclic compounds, allyl ethers, allyl esters, and derivatives thereof.

Acrylic esters and methacrylic esters are preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxy acrylate, nonyl phenyloxyethyl acrylate, 1,3-dioxolane acrylate, hexanediol diacrylate, butanediol diacrylate, neopentyl glycol diacrylate, trimethylolpropane triacrylate, tricyclodecanedimethylol diacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxanediacrylate, 2-(2-hydroxy-1,1-dimethylethyl)-5,5-dihydroxymethyl-1,3-dioxanetriacrylate, triacrylate of propylene oxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentyl glycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compound is commercially available. Examples of the commercially available compounds include Alonix M-309, M-310, M-315, M-400, M-6100, M-8030, M-8100 (trade names, all available from Toa Gosei Kagaku Kogyo Co., Ltd.) and Kayarad HX-220, HX-620, R-551, TMPTA, D-330, DPHA, DPCA-60, R604, R684 (trade names, all available from Nippon Kayaku Co., Ltd.).

The cross-linkable polymer used in the present invention has a functional group which is reactive to a radical. The polymer may be a homopolymer or a copolymer with a monomer which does not have a reactive group. Examples of the polymer include a polymer having a double bond (ethylenic or another unsaturated bond) in its molecule, a polymer having a polyoxyalkylene unit in its molecule and a polymer containing a halogen atom in its molecule. A polymer which forms a polymer radical by dehalogenatation or dehydrogenation is also available as the cross-linkable polymer. Further, two polymer radicals may be coupled with each other by a cross-linking reaction. Furthermore, a polymer may be cross-linked by a reaction with an ethylenically unsaturated polymerizable compound.

The reactive functional group is contained in the side chain or the main chain. The functional group may be introduced into the side chain by a polymeric reaction of the polymer. The functional group may also be introduced into the side chain by a polymerization of monomers having the group. Examples of the repeating units of the polymer having a functional group in its side chain are shown below.

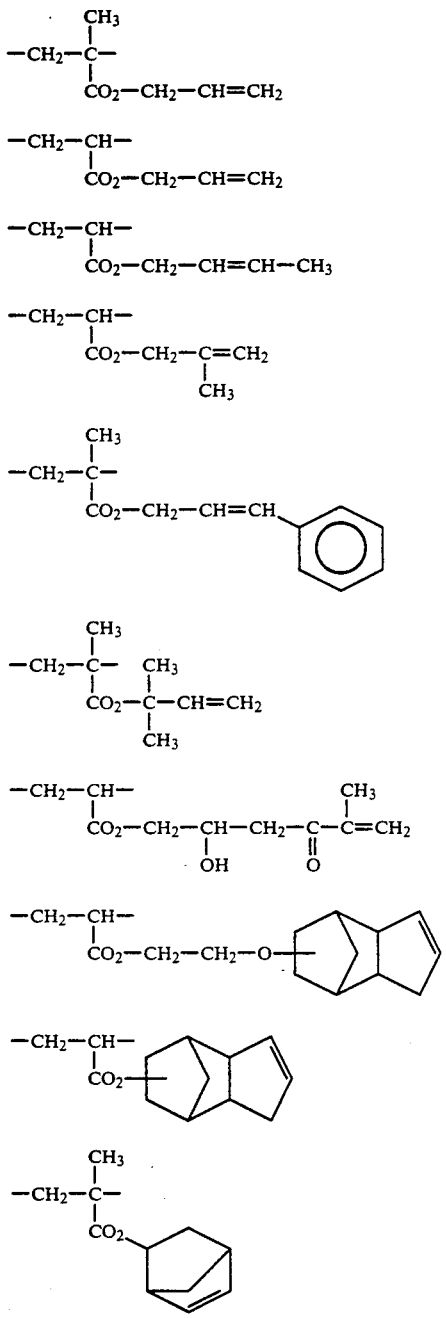

The other examples of the polymers include a synthetic rubber (e.g., polybutadiene, polyisoprene, styrene-isoprene copolymer, styrene-butadiene-acrylonitrile copolymer), a natural rubber, polyethylene oxide, polypropylene oxide, polyvinyl chloride (including a copolymer thereof), polyvinylidene chloride (including a copolymer thereof), polyvinyl acetate (including a copolymer thereof), chlorinated polyethylene, polyvinyl butyral, methyl cellulose, ethyl cellulose and butyl cellulose.

The cross-linkable polymer is described at pages 147 to 192 in "Polymer Reaction" (edited by Polymer Society in Japan, Kyoritsu Shuppan, 1978).

In the case that an alkaline solution is used to remove the unhardened area, the cross-linkable polymer preferably contains an acidic functional group in its molecule. Examples of the acidic functional groups include carboxyl, an acid anhydride group, phenolic hydroxyl, sulfo, sulfonamido and sulfonimido. In the case that a binder of the layer is a polymer made by an addition reaction, the cross-linkable polymer may be a copolymer of a monomer having an cross-linkable group with a monomer having an acidic group. Examples of the monomers include acrylic acid, methacrylic acid, crotonic acid, maleic acid, phthalic acid, maleic anhydride, p-carboxystyrene, p-hydroxystyrene, p-hydroxyphenylacrylamide, hydroxyethyl methacrylate, hydroxyethylmethacrylamide and p-vinylbenzenesulfonic acid.

The polymerizable compound and the cross-linkable polymer can be used singly or in combination of two or more compounds or polymers. Further, a compound formed by bonding a polymerizable functional group such as a vinyl group or a vinylidene group to chemical structure of a reducing agent or a colored substance is also used as the polymerizable compound. A light-sensitive material using a compound which serves as both a reducing agent and a polymerizable compound or both a colored substance and a polymerizable compound can be also included in the embodiments of the light-sensitive material.

The amount of the polymerizable compound and the cross-linkable polymer contained in the polymerizable layer is preferably in the range of 3 to 90% by weight, more preferably in the range of 15 to 60% by weight, based on the whole amount of the polymerizable layer.

Base and Base Precursor

The light-sensitive material may contain a base or base precursor. The base or base precursor is preferably used in the heat development process.

Various organic or inorganic bases and their precursors (e.g., decarboxylation type, thermal decomposition type, reaction type and complex salt-formation type) are available.

Inorganic bases are described in Japanese Patent Provisional Publication No. 62(1987)-209448. Examples of the organic bases include tertiary amine compounds (described in Japanese Patent Provisional Publication No. 62(1987)-170954), bisamidine compounds, trisamidine compounds or tetraamidine compounds (described in Japanese Patent Provisional Publication No. 63(1988)-316760) and bisguanidine compounds, trisguanidine compounds or tetraguanidine compounds (described in Japanese Patent Provisional Publication No. 64(1989)-68746). In the present invention, a base having a pKa value of not less 7 is preferred.

In the present invention, a base precursor is preferred to the base from the viewpoint of the storage stability of the light-sensitive material.

Preferred examples of the base precursors include salts of organic acids with bases which is decarboxylated under heating and urea compounds which release bases under heating. Examples of the reaction mechanisms of the base precursor include a reaction between the base precursor and a salt containing anion having higher compatibility with transition metal acetylide or transition metal ion than acetylide anion, and a reaction of introducing into water both of a basic metallic compound which is hardly dissolved in water and a compound capable of reacting with metal ion of the basic metallic compound in a water medium to form a complex salt so as to release a base through a reaction between those two compounds in the presence of water.

The base precursor preferably releases a base at a temperature in the range of 50° to 200° C., and more preferably in the range of 80° to 160° C.

The light-sensitive material employing a base or a base precursor is described in Japanese Patent Provisional Publication No. 62(1987)-264041. A light-sensitive material employing a tertiary amine as a base is described in Japanese Patent Provisional Publication No. 62(1987)-170954. A light-sensitive material employing dispersed grains of a hydrophobic organic base compound having a melting point of 80° to 180° C. is described in Japanese Patent Provisional Publication No. 62(1987)-209523. A light-sensitive material employing a guanidine derivative having a solubility of not more than 0.1% is described in Japanese Patent Provisional Publication No. 63(1988)-70845. A light-sensitive material employing hydroxides or salts of alkali metals or alkaline earth metals is described in Japanese Patent Provisional Publication No. 62(1987)-209448.

A light-sensitive material employing acetylide compounds as a base precursor is described in Japanese Patent Provisional Publication No. 63(1988)-24242. A light-sensitive material employing a salt of propiolic acid as a base precursor and further containing silver, copper, a silver compound or a copper compound as a catalyst of the base production reaction is described in Japanese Patent Provisional Publication No. 63(1988)-46446. A light-sensitive material containing the salts of propiolic acid under the condition of being separated from the silver, copper, silver compound or copper compound is described in Japanese Patent Provisional Publication No. 63(1988)-81338. A light-sensitive material containing free ligands in addition to the salts of propiolic acid and the silver, copper, silver compound or copper compound is described in Japanese Patent Provisional Publication No. 63(1988)-97942. A light-sensitive material employing salts of the propiolic acid as a base precursor and further containing heat fusible compounds as an accelerator of the base production reaction is described in Japanese Patent Provisional Publication No. 63(1988)-46447. A light-sensitive material employing a salt of sulfonyl acetate as a base precursor and further containing heat fusible compound as an accelerator for the base production reaction is described in Japanese Patent Provisional Publication No. 63(1988)-48453. A light-sensitive material employing compounds in which isocyanate or isothiocyanate is bonded to an organic base is described in Japanese Patent Provisional Publication No. 63(1988)-96652. A light-sensitive material containing a nucleating agent as a decomposition accelerator of the above compound is described in Japanese Patent Provisional Publication No. 63(1988)-173039.

A light-sensitive material employing as a bas precursor a bisamidine or trisamidine salt of carboxylic acid capable of being decarboxylated is described in Japanese Patent Provisional Publication No. 64(1989)-9441. A light-sensitive material employing as a base precursor a bisguanidine or trisguanidine salt of carboxylic acid capable of being decarboxylated is described in Japanese Patent Provisional Publication No. 64(1989)-68749.

The base or the base precursor can be used in an amount of preferably 0.5 to 50 mole, more preferably 1 to 20 mole based on 1 mole of silver halide.

Colorant

In the first embodiment of the present invention, a colorant is contained in the light-sensitive material.

The colorant has a function of forming a visible (to human eye) color image (e.g., a color proof). There is no specific limitation on the colorant provided that the colorant does not remarkably inhibit the hardening reaction of the polymerizable compound or the crosslinkable polymer, the sensitivity of silver halide or the developing reaction. Various known pigments and dyes are available.

The pigments are commercially available. Further, pigments are described in various publications such as "Handbook of Color Index", "New Handbook of Pigments", (Nippon Ganryo Gijutsu Kyokai (ed.), 1977), "New Applied Technique of Pigments", (CMC Publishing, 1986), and "Technique of Printing Ink", (CMC Publishing, 1984).

Examples of the pigments include black pigments, yellow pigments, orange pigments, brown pigments, red pigments, violet pigments, blue pigments, green pigments, fluorescent pigments, metal powder pigments and polymer pigments. Concrete examples of the pigments include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxadine pigments, isoindolinone pigments, quinophthalone pigments, dye-type lake pigments, azine pigments, nitroso pigments, nitro pigments, natural pigments, fluorescent pigments and inorganic pigments.

The pigment can be per se used or can be used after being subjected to surface treatment. As the surface treatment, there can be employed a method of coating a resin or wax on the surface of the pigment, a method of depositing a surface active agent thereon, a method of bonding a reactive substance (e.g., silane coupling agent, epoxy compound and polyisocyanate) to the surface of the pigment. Those methods are described, for example, in "Nature and Application of Metal Soap", (Saiwai Shobo), "Technique of Printing Ink", (CMC Publishing, 1984), and "New Applied Technique of Pigments", (CMC Publishing, 1986).

The particle size of the pigment is preferably in the range of 0.01 to 10 μm, more preferably in the range of 0.05 to 1 μm.

The pigment can be introduced into the light-sensitive polymerizable layer (or the polymerizable layer) by adding or dispersing it into a coating solution for the formation of the layer. For dispersing the pigment in the coating solution, various dispersing techniques conventionally used for the preparation of ink or toner can be employed. As the dispersing device, there can be used a sand mill, an attritor, a pearl mill, a super mill, a ball mill, an impeller, a disperser, a KD mill, a colloid mill, a dynatron a three-roll mill and a press kneader. Details of the devices are described in "New Applied Technique of Pigments", (CMC Publishing, 1986).

Dyes are also available as the colorant. The dye, that is, a material being itself colored, there can be used those commercially available and those described in various publications (e.g., "Handbook of Dyes", Yuki Kagaku Kyokai (ed.), 1970). Concrete examples of the dyes include azo dyes, metal complex salt azo dyes, pyrazolone azo dyes, anthraquinone dyes, quinonimine dyes and methine dyes.

The upper limit of the amount of the colorant is determined provided that the colorant does not remarkably inhibit the hardening reaction, the sensitivity of silver halide or the developing reaction. The amount is preferably so determined that the optical density of the formed image is analogous to that of the printed matter. The color density depends on the nature of each of the pigment or dye. The amount is usually in the range of 0.01 to 2 g/m$^2$, and more preferably in the range of 0.02 to 1 g/m$^2$.

Two or more colorants may be used in combination. The hue (absorption spectrum) of the colorant is preferably analogous to that of the printing ink. In the present invention, the pigment is preferred to the dye, since the printing ink usually contains a pigment.

Support

The support of the light-sensitive material is made of a chemically and thermally stable substance. The support may be transparent. Examples of the substances include polyolefins (e.g., polyethylene, polypropylene), polyvinyl halides (e.g., polyvinyl chloride, polyvinylidene chloride), cellulose derivatives (e.g., cellulose acetate, nitrocellulose, cellophane), polyamides, polystyrene, polycarbonate, polyimides and polyesters. Polyethylene terephthalate and polycarbonate (including thermally treated substances) are preferred, since they are excellent in the dimensional stability and the transparency. A biaxially stretched polyethylene terephthalate is particularly preferred. The support may be surface treated with corona discharge or ultraviolet irradiation. An undercoating layer may be provided on the support.

Binder of Polymerizable Layer

A binder may be added to the polymerizable layer of the multi-layered light-sensitive material to enhance the strength of the layer. The binder preferably does not decrease the solubility of the unhardened area of the polymerizable layer in the solvent. The binder also preferably doe snot increase the solubility of the hardened area in the solvent. Various natural or synthetic polymers are available as the binder. The synthetic polymer can be formed by an addition reaction (of a vinyl monomer) or a condensed reaction. Examples of the synthetic polymers include vinyl polymers (e.g., polystyrene, polyacrylate, polymethacrylate), polyesters, polyamides, polyurethanes, polyester-polyamides and copolymers thereof.

In the case that an alkaline solution is used to remove the unhardened area, the binder preferably contains an acidic functional group in its molecule. Examples of the acidic functional groups include carboxyl, an acid anhydride group, phenolic hydroxyl, sulfo, sulfonamido and sulfonimido. In the case that the binder is a polymer made by an addition reaction, the binder may be a copolymer of a monomer having an cross-linkable group with a monomer having an acidic group. Examples of the monomers include acrylic acid, methacrylic acid, crotonic acid, maleic acid, phthalic acid, maleic anhydride, p-carboxystyrene, p-hydroxystyrene, p-hydroxyphenylacrylamide, hydroxyethyl methacrylate, hydroxyethylmethacrylamide and p-vinylbenzenesulfonic acid.

There is not specific limitation on the amount of the binder so long as the binder does not inhibit the hardening reaction in the polymerizable layer. The amount is usually in the range of 0 to 80% by weight, and preferably in the range of 0 to 70% by weight, based on the whole amount of the polymerizable layer.

Polymerization Inhibitor

A polymerization inhibitor may be added to the polymerizable layer to prevent the dark reaction. Various known polymerization inhibitors are available. Examples of the polymerization inhibitors include a nitrosamine, a thiourea, a thioamide, a urea compound, a phenol derivative, a nitrobenzene derivative and an amine. Concrete examples include Al salt of cupferron, N-nitrosodiphenylamine, allylthiourea, an aryl phosphate, p-toluidine, -toluquinone, nitrobenzene, pyridine, phenathiazine, $\beta$-naphthol, naphthylamine, t-butylcatechol, phenothiazine, chloranil, p-methoxyphenol, pyrogallol, hydroquinone and an alkyl or aryl-substituted hydroquinone.

Organic Metallic Salt

An organic metallic salt can be added to the light-sensitive layer containing silver halide. The organic metallic salt relates to an oxidation-reduction reaction at the heat development wherein the latent image of silver halide functions as the catalyst. It is considered that the organic metallic salt has a function of accelerating the oxidation-reduction reaction. The organic silver salt is described in Japanese Patent Provisional Publications No. 59(1984)-55429 and No. 62(1987)-3246.

The metal of the organic salt preferably silver. The organic moiety of the salt preferably is an aliphatic carboxylic acid, an aromatic carboxylic acid, a thiocarbonyl compound having a mercapto group or $\alpha$-hydrogen, an acetylene compound and an imino compound.

Examples of the aliphatic carboxylic acids include acetic acid, butyric acid, succinic acid, sebacic acid, adipic acid, oleic acid, linoleic acid, linolenic acid, tartaric acid, palmitic acid, stearic acid, behenic acid and camphoric acid. When the number of the carbon atoms is small, the formed silver salt is unstable. Therefore, the carboxylic acid should contain a relatively large number of the carbon atoms.

Examples of the aromatic carboxylic acids include benzoic acid derivatives, quinolinic acid derivatives, naphthoic acid derivatives, salicylic acid derivatives, gallic acid, tannic acid, phthalic acid, phenylacetic acid derivatives and pyromellitic acid.

Examples of the thiocarbonyl compounds include 3-mercapto-4-phenyl-1,2,4-triazole, 2-mercaptobenzimidazole, 2-mercapto-5-aminothiadiazole, 2-mercaptobenzothiazole, s-alkylthioglycolic acid (the number of the carbon atoms in the alkyl group is in the range of 12 to 22), dithiocarboxylic acids (e.g., dithioacetic acid), thioamides (e.g., thiostearamide), 5-carboxy-1-methyl-2-phenyl-4-thopyridine, mercaptotriazine, 2-mercaptobenzoxazole and 3-amino-5-benzylthio-1,2,4-triazole. The mercapto compounds described in U.S. Pat. No. 4,123,274 are also available.

Examples of the imino compounds include benzotriazole and derivatives thereof, 1,2,4-triazole, 1H-tetrazole, carbazole, saccharin, imidazole and derivatives thereof. Examples of the benzotriazole derivatives include alkyl-substituted benzotriazoles (e.g., methylbenzotriazole), halogen-substituted benzotriazoles (e.g., 5-chlorobenzotriazole), carboimidobenzotriazoles (e.g., butylcarboimidobenzotriazole), nitrobenzotriazoles, sulfobenzotriazoles, carboxybenzotriazoles and salts thereof and hydroxybenzotriazoles. U.S. Pat. No. 4,220,709 describes 1,2,4-triazole and 1H-tetrazole.

A similar effect can be obtained in the case that the organic moiety of the organic metallic salt in place of the salt itself is added to the light-sensitive layer. Two or more organic metallic salts can be used in combination.

The organic silver salt is generally used in an amount of 0 to 10 moles, preferably 0 to 1 mole based on 1 mole of silver halide. The total amount of the silver halide and the organic silver salt contained in the light-sensitive layer is preferably in the range of 1 mg/m$^2$ to 5 g/m$^2$, more preferably in the range of 10 mg/m$^2$ to 0.5 g/m$^2$ in terms of silver.

Binder of the Light-Sensitive Layer

A hydrophilic binder is preferably contained in the light-sensitive layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer which swells in water has an affinity to water, but is not soluble in water because of the cross-linking structure of the polymer.

The natural or synthetic polymers can be used as the hydrophilic binder. Examples of the natural hydrophilic polymer include polysaccharide such as starch derivatives, cellulose derivatives, alginic acid, pectic acid, gum arabic and pullulan, and protein such as casein and gelatin. The denatured polymers are also available. In preparation of the light-sensitive material (at the stage of coating or drying), these natural polymers may be denatured or cross-linked. The synthetic hydrophilic polymer is a polymer or copolymer of water-soluble monomers. The water-soluble monomers have a hydrophilic group such as carboxyl, acid anhydride, hydroxyl, sulfo (including a salt thereof), amido, amino and ether. Examples of the monomer are described in "Application and Market of Water-soluble Polymer" (CMC, p. 16–18). A copolymer formed from the above-mentioned monomers by polymerization or cross-linking (cf., copolymers described in U.S. Pat. No. 4,913,998) can also be used.

The other examples of the hydrophilic polymer include polyvinyl alcohol, polyvinyl ether, polyvinyl pyrrolidone and derivatives thereof. Polyvinyl alcohol is particularly preferred.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl methacrylate and acrylamide. Polyvinyl alcohol may also be denatured after the saponification. Hydroxyl in polyvinyl alcohol can be modified by etheration, esterification or acetylation. A cross-linked polyvinyl alcohol is also available. Examples of the cross-linking agent include aldehyde, methylol compounds, diisocyanate, divinyl compounds, dicarboxylic acids, borates, titanium and copper. The denatured or cross-linked polyvinyl alcohol is described in "Poval" 3rd ed., Kobunshi Kanko-Kai, p. 281–285 and 256–260.

The molecular weight is preferably in the range of 3,000 to 500,000. The hydrophilic polymer binder is preferably used in an amount in the range of 0.05 g to 20 g/m$^2$, and more preferably in the range of 0.1 to 10 g/m$^2$.

The light-sensitive layer preferably has a function of preventing oxygen from the air to the polymerizable layer at the heat development process. The oxygen functions as a polymerization inhibitor. Therefore, the hydrophilic polymer preferably has a low transmission coefficient of oxygen of not more than $1.0 \times 10^{-11}$ cm$^3$·cm/cm$^2$·sec·cmHg.

The examples of the hydrophilic polymer binder having the low transmission coefficient of oxygen include polyvinyl alcohol and its derivatives, gelatin and copolymer of vinylidene chloride. The derivatives of polyvinyl alcohol include the above-mentioned denatured polyvinyl alcohol (formed by saponification of the block copolymer of polyvinyl acetate and another monomer). The molecular weight is preferably in the range of 3,000 to 500,000.

Polyvinyl alcohol preferably has a high saponification degree of not less than 70%, more preferably of not less than 80%, most preferably of not less than 95%. The polyvinyl alcohol having the high saponification degree has a very low transmission coefficient of oxygen.

Heat Development Accelerator

The light-sensitive material can contain a heat development accelerator. The heat development accelerator may be contained in any layers of the light-sensitive material. The function of the heat development accelerator has not yet been analyzed. There are two assumptions. According to one assumption, the heat development accelerator has a function of increasing the plasticity of a polymer (contained in the polymerizable layer of the light-sensitive layer). According to the other assumption, the accelerator has another function of accelerating the dispersion of the components in the layers when it is dissolved by heat of the development process. As a result, the reactions (decomposition of a base precursor, reduction of silver halide and a hardening reaction) at the heat development process are accelerated.

The heat development accelerator has ben known as a plasticizer. The known plasticizers are described in "Plastic Additives (written in Japanese)", p. 21–63 (Taisei-sha); Plastics Additives, Second Edition; Hanser Publishers, Chapter 5, p. 251–296; Thermoplastic Additives, Marcel Dekker Inc., Chapter 9, p. 345–379; Plastic Additives, An industrial Guide, Noyes Publications, Section 14, p. 333–485: The Technology of Solvents and Plasticizers, John Wiley & Sons Inc., Chapter 15, p. 903–1027; Industrial Plasticizers, Pergamon Press; Plasticizer Technology, Vol. 1, Reinhold Publishing corp.; and Plasticization and Plasticizer Process, American Chemistry.

The heat development accelerator has also been known as a hot-melt solvent. Examples of the hot-melt solvent include polar compounds described in U.S. Pat. No. 3,347,675; 1,10-decandiol, methyl anisate and biphenyl suberate described in "Research Disclosure" pp. 26–28, (December, 1976); sulfonamide derivatives; polyethylene glycol derivatives; cyclic amides, aromatic compounds; esters and amides; ethers and thioethers; ketones, carbonates, sulfoxides, phosphonates; and phenols.

Preferred examples of the heat development accelerator include glycols (e.g., diethylene glycol, dipropylene glycol), polyhydric alcohols (e.g., glycerol, butanediol, hexanediol), saccharides, formates, ureas (e.g., urea, diethylurea, ethyleneurea, propyleneurea), a urea resin, a phenol resin, amides (e.g., acetamide, propionamide) and sulfonamides. Two or more heat development accelerators can be used in combination. The heat development accelerators can be added to two or more layers of the light-sensitive material.

The amount of the heat development accelerator is preferably in the range of 0 to 2 g/m$^2$, and more preferably in the range of 0 to 1 g/m$^2$.

The Other Additives

The light-sensitive material can contain the other additives such as an antifogging agent, a silver development accelerator, a development stopping agent, a surface active agent and a dispersing agent.

The antifogging agent, the silver development accelerator and the dispersing agent often have two or more functions. Accordingly, it is difficult to classify these compounds. Examples of these compounds include cyclic amides, polyethylene glycol derivatives, thiol derivatives, acetylene compounds, sulfonamide derivatives and azoles or azaindenes described in "Research Disclosure" pp. 24-25 (1978). These compounds are generally used in an amount of $10^{-7}$ to 1 mole based on 1 mole of the silver halide.

The development stopping agent can be used in the light-sensitive material to obtain a clear image constantly regardless of the temperature and time for the development process. The development stopping agents are compounds to neutralize a base or react with a base to reduce the base concentration in the layer to stop development, or compounds that mutually react with silver or a silver salt to suppress development, after the appropriate development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof.

Coloring Agent

A coloring agent can be added to the light-sensitive material as an antihalation agent. Various pigments and dyes are available as the coloring agent provided that the agent does not inhibit the hardening reaction of the polymerizable layer and the sensitivity or the developing reaction of silver halide. Where the coloring agent is used as the antihalation agent, the color of the agent should absorb the light used in the exposing step. Examples of the coloring agent are the same as those of the colorant.

The coloring agent can also be contained in the light-sensitive layer or an adjacent layer thereof as an antiirradiation dye. The antiirradiation dye is described in U.S. Pat. Nos. 3,697,037, 3,423,207, 2,865,752, U.K. Patents No. 1,030,392 and No. 1,100,546.

The amount of the coloring agent is determined provided that the colorant does not remarkably inhibit the hardening reaction, the sensitivity of silver halide or the developing reaction. The amount is usually in the range of 0.01 to 2 g/m$^2$, and more preferably in the range of 0.02 to 1 g/m$^2$.

In the first embodiment of the present invention, the coloring agent may disturb the hue of the colorant contained in the polymerizable layer. Therefore, the coloring agent is preferably not used in the first and second embodiments, or the amount is preferably as small as possible. On the other hand, there is no such problem in the second and third embodiments using color toner.

The coloring agent can be contained in an optional layer such as a backing layer, an intermediate layer. The coloring agent may also be contained in two or more layers. Two or more coloring agents can be used in combination.

Polymerization Initiator

In the systems (B) and (C) described at the item of [Reducing agent], a thermal polymerization initiator or a photopolymerization initiator is contained in the light-sensitive material. Various known thermal polymerization initiators and photopolymerization initiators are available. When the photopolymerization initiator is used, the light-sensitive material is uniformly exposed to light after the developing step.

A thermal polymerization initiator is described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds such as azobisisobutyronitrile, 1,1'-azobis(1-cyclohexanecarbonitrile), dimethyl-2,2'-azobisisobutyrate, 2,2'-azobis(2-methylbutyronitrile) and azobisdimethylbaleronitrile; ;organic peroxides such as benzoyl peroxide, di-t-butyl peroxide, dicumyl peroxide, t-butyl hydroperoxide and cumene hydroperoxide; inorganic peroxides such as hydrogen peroxide, potassium persulfate and ammonium persulfate; and sodium p-toluenesulfinic acid.

The photopolymerization initiator is described in Oster et al., Chemical Review, vol. 68, p. 125-151 (1968) and Kosar, Light-Sensitive System, p. 158-193, John Willey & Sons (1965). Examples of the photopolymerization initiator include carbonyl compounds (e.g., α-alkoxyphenyl ketones, polycyclic quinones, benzophenone derivatives, xanthones, thioxanthones and benzoines), halogen-containing compounds (e.g., chlorosulfonyl or chloromethyl polynuclear aromatic compounds, chlorosulfonyl or chloromethyl heterocyclic compounds, chlorosulfonyl or chloromethyl benzophenones and fluorenones), haloalkanes, α-halo-α-phenylacetophenones, redox couples of photo-reducible dye and reducing agent, organic sulfur compounds, peroxides, photo semi-conductors (e.g., titanium dioxide and zinc oxide), metallic compounds (e.g., ferrous salt, metallic salt of carbonyl compound, metal complex and uranyl salt), silver halide, azo compounds and diazo compounds.

Concrete examples of the photopolymerization initiators include 2-dimethoxy-2-phenylacetophenone, 2-methyl-[4-(methylthio)phenyl] -2-morpholino-1-propanone, benzoin butyl ether, benzoinisopropyl ether, benzophenone, Michler's ketone, 4,4-diethylaminobenzophenone, chloromethylbenzophenone, chlorosulfonylbenzophenone, 9,10-anthraquinone, 2-methyl-9,10-anthraquinone, chlorosulfonyl anthraquinone, chloromethyl anthraquinone, 9,10-phenanthrenequinone, xanthone, chloroxanthone, thioxanthone, chlorothioxanthone, 2,4-diethylthioxanthone, chlorosulfonyl-thioxanthone, chloromethylbenzothiazole, chlorosulfonylbenzoxazole, chloromethylquinoline, fluorene and carbon tetrabromide.

Examples of the photo-reducible dyes include methylene blue, thionine, rose bengal, erythrocin-$\beta$, eosine, rhodamine, phloxin-$\beta$, safranine, acryflavine, riboflavine, fluorescein, uranine, benzoflavine, acryzine orange, acryzine yellow and benzanthrone.

Examples of the reducing agents (hydrogen donative compounds) employable with these dyes include $\beta$-diketones (e.g., dimedone and acetylacetone), amines (e.g., triethanolamine, diethanolamine, monoethanolamine, diethylamine and triethylamine), sulfinic acids (e.g., p-toluenesulfinic acid and benzenesulfinic acid), salts of those sulfinic acids, N-phenylgrycine, L-ascorbic acid and salts thereof, thiourea, and allylthiourea.

A molar ratio between the photo-reducible dye and the reducing agent is preferably in the range of 1:0.1 to 1:10.

Also preferably employable as the photopolymerization initiators are commercially available ones such as Irgacure-651 ™ and Irgacure-907 ™ (produced by Ciba-Geigy).

The polymerization initiator is used in an amount of preferably 0.001 to 0.5 g, and more preferably 0.01 to 0.2 g based on 1 g of the polymerizable compound.

Adhesive Layer

An adhesive layer is provided in the light-sensitive material used in the second embodiment. The adhesive layer should be made of a material which is not dissolved in a solvent used at the removing step. The layer has an adhesion to the color toner used at the toning step. The adhesive layer can be made of a mixture of a polymer and a plasticizer (described at the item of [Heat development accelerator]). The adhesive layer can also be made of a mixture of a polymer and an oligomer. Further, the adhesive layer can be made of an elastic polymer having a secondary transition point of not higher than 10° C. The layer of the elastic polymer is particularly preferred. A plasticizer or an oligomer may be added to the layer of the elastic polymer.

The polymer used in the adhesive layer preferably is a natural or synthetic rubber. Examples of the synthetic rubber include polyisobutylene, nitryl rubber, butyl rubber, chlorinated rubber, polyvinyl isobutyl ether, silicon elastomer, neoprene and a copolymer rubber (e.g., styrenebutadiene copolymer, styrene-isobutylene copolymer). The copolymer may be any of a random copolymer, a block copolymer and a graft copolymer. The thickness of the adhesive layer is preferably in the range of 0.01 to 10 $\mu$m, and more preferably in the range of 0.05 to 5 $\mu$m.

Optional Layers

Optional layers may be added to the single-layered or multi-layered light-sensitive materials. An overcoating layer (or a cover film layer) has a function of protecting the surface of the light-sensitive material or a function of preventing oxygen in the air from inhibiting the polymerization reaction. A backing layer may function as an antihalation layer. The backing layer may also function of preventing adhesion between two light-sensitive materials when they are stocked. An intermediate layer may also function as an antihalation layer. The backing layer may also function of adjusting adhesion between two layers. A layer containing a matting agent may be provided on the surface facing an image receiving material. The matting agent has a function of contacting tightly the light-sensitive material with the image receiving material to prevent bubble formed between the materials. Various known matting agents are available. The matting agent may also be contained in the image receiving material.

An overcoating layer can be prepared by coating a solution of a polymer on a light-sensitive material. The overcoating layer may be formed by the lamination just before the image forming method. The hydrophilic binders described at the item of [Binder of the light-sensitive layer] are available as the polymer of the overcoating layer. Polyvinyl alcohols are particularly preferred. The polyvinyl alcohol preferably has a high saponification degree of not less than 85%, and more preferably of not less than 95%. The polyvinyl alcohol having the high saponification degree has a very low transmission coefficient of oxygen. The overcoating layer also functions as a protective layer. The overcoating layer may be peeled from the light-sensitive material just before the laminating step. Two or more overcoating layers may be provided on the light-sensitive material.

The present invention is further described by the following examples without limiting the invention.

EXAMPLE 1

Preparation of Light-Sensitive Material

A single-layered light-sensitive material was prepared in the following manner.

Preparation of Support

A biaxially stretched polyethylene terephthalate film having the thickness of 100 $\mu$m wa used as the support.

Formation of Adhesive Layer

On the support, 7.5 wt. % methylene chloride solution of styrene/butadiene copolymer (copolymerization molar ratio=25/75) was coated and dried to form an adhesive layer having the thickness of 0.5 $\mu$m.

Preparation of Silver Halide Emulsion

Gelatin, potassium bromide and water were placed in a vessel and kept at 55° C. An appropriate amount of ammonium was added to the vessel. Further, an aqueous solution of silver nitrate and an aqueous solution of potassium bromide containing hexachloroiridate (III) (the molar ratio of iridium to silver is $10^{-7}$ mole) were added to the vessel according to a double jet method while keeping the pAg of 7.60 in the reaction vessel. Potassium iodide was then added to the mixture to prepare a monodispersed silver iodobromide emulsion having the average grain size of 0.25 $\mu$m (content of silver iodide: 0.2 mole %). In the emulsion, 98% of the silver halide grains are within the range of ±40% of the average grain size. The emulsion was desalted, and adjusted to pH 6.2 and pAg 8.6. The emulsion was then subjected to gold and sulfur sensitization using sodium thiosulfate and chloroauric acid. Further, 200 ml of methanol solution of the following sensitizing dye (concentration: 2.0M/l) was added to 1 kg of the emulsion. The mixture was stirred for 15 minutes at 60° C. to prepare a silver halide emulsion having a sensitivity at 488 nm.

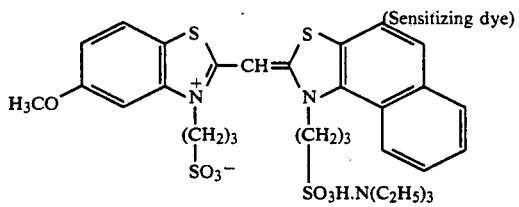
(Sensitizing dye)

Preparation of Base Precursor Dispersion

In 750 g of 3 wt. % aqueous solution of polyvinyl alcohol was dispersed 250 g of powder of the following base precursor using Dynomill dispersing device. The particle size of the base precursor was about 0.48 μm.

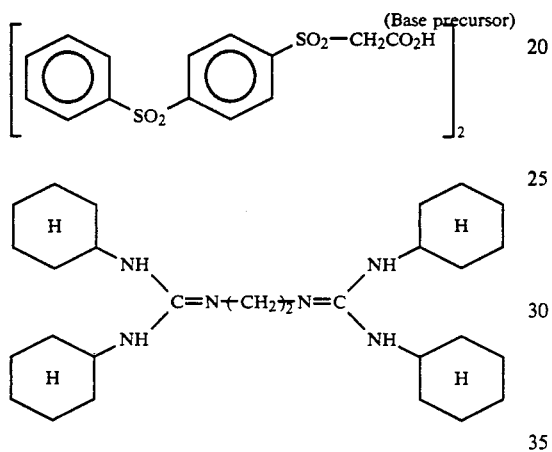
(Base precursor)

Formation of Light-Sensitive Polymerizable Layer

The following composition was uniformly dissolved to obtain an oily solution. To the oily solution was added 14 g of the silver halide emulsion, and the mixture was stirred at 13,000 rpm for 5 minutes using a homogenizer to emulsify the silver halide emulsion in the oily solution.

| Oily solution | Amount |
|---|---|
| Trimethylolpropane triacrylate (polymerizable compound) | 18 g |
| The following copolymer | 0.4 g |
| Reducing agent (J) | 10.0 g |
| The following additive (1) | 0.03 g |
| The following additive (2) | 0.05 g |
| Methylene chloride | 20 g |

(Copolymer)

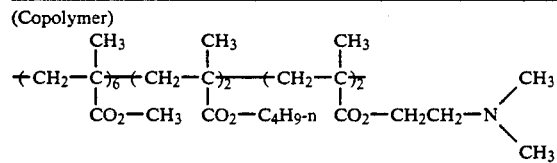

(Additive (1))

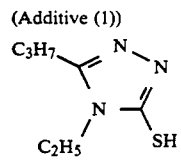

(Additive (2))

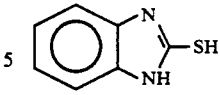

To a solution of 4 g of allyl methacrylate/methacrylic acid copolymer (copolymerization ratio=85/15) in 30 g of propyleneglycol monomethyl ether was added 10 g of the above-prepared emulsion. To the mixture were added 8 g of the ba precursor dispersion and 2 g of the following pigment. The resulting mixture was stirred at 13,000 rpm for 5 minutes to prepare a coating solution of a light-sensitive polymerizable layer. The coating solution was coated and dried on the adhesive layer to form a light-sensitive polymerizable layer having the thickness of about 4 μm.

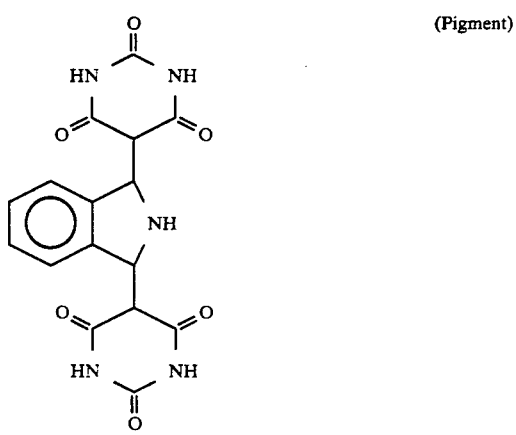
(Pigment)

Formation of Overcoating Layer

With 10 wt. % aqueous solution of polyvinyl alcohol having the saponification degree of 98.5% (PVA-117 produced by Kuraray Co., Ltd.) was mixed 4 g of 5 wt. % aqueous solution of the surface active agent to prepare a coating solution. The coating solution was coated and dried on the light-sensitive layer to form an overcoating layer having the dry thickness of about 3.0 μm.

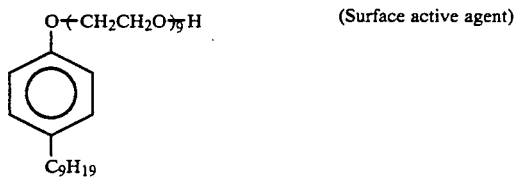
(Surface active agent)

Preparation of Yellow Toner

Yellow toner was prepared by using the following composition.

| Yellow toner | Amount |
|---|---|
| Pigment Yellow 74 (C.I.: #11741) | 4380.0 g |
| Cellulose acetate | 6538.0 g |
| Acetone | 27669.6 g |
| Water | 22680.0 g |
| Dimethyl polysiloxane | |

| Yellow toner | Amount |
|---|---|
| (1253.0 g based on 11 kg of toner) | |

Water was well mixed with acetone, and the mixture was placed in a ball mill. The mill contains stainless balls having the diameter of 0.049 cm, which are stirred at 150 rpm. The mixture was prepared under an atmosphere of nitrogen. About ⅜ part of the subject weight of cellulose acetate was added to the mill over 3 to 5 minutes. The mixture was further stirred for about 2 minutes. The pigment was added to the mixture over 2 minutes. The remaining cellulose acetate was then added to the mixture.

The resulting mixture was further stirred at 150 rpm for 4 hours. The contents were washed with water and filtered out. The wet toner was collected, washed with water, dried in an oven at 115° to 125° C., and powdered in a hammer mill. The toner was mixed with dimethyl polysiloxane in a blender to treat the surface of the toner.

The toner was further mixed and treated with beads of ionized hydrocarbon copolymer having the average particle size of 23 μm (the same amount as that of the toner) in a desk blender.

Preparation of Magenta Toner

Magenta toner was prepared in the same manner as in preparation of yellow toner except that the following composition was used and the stirring time was changed from 4 hours to 6 hours.

| Magenta toner | Amount |
|---|---|
| Pigment Red 122 (Quidomagenta) | 3315.0 g |
| Pigment Red 123 (C.I. #71145) | 1560.0 g |
| Cellulose acetate | 6929.0 g |
| Acetone | 27669.6 g |
| Water | 22680.0 g |
| Dimethyl polysiloxane | |
| (1679.0 g based on 11.8 kg of toner) | |

Preparation of Cyan Toner

Cyan toner was prepared in the same manner as in preparation of yellow toner except that the following composition was used and the stirring time was changed from 4 hours to 6 hours.

| Cyan toner | Amount |
|---|---|
| Copper phthalocyanine (Pigment Blue 15, C.I.: #74160) | 1064.0 g |
| Pigment Green 7 (C.I. #74260) | 943.0 g |
| Cellulose acetate | 7981.0 g |
| Acetone | 27669.6 g |
| Water | 22680.0 g |
| Dimethyl polysiloxane | |
| (574.9 g based on 10 kg of toner) | |

Preparation of Black Toner

Black toner was prepared in the same manner as in preparation of yellow toner except that the following composition was used and the stirring time was changed from 4 hours to 6 hours.

| Black toner | Amount |
|---|---|
| Carbon black (Pigment Black 7, C.I.: #77266) | 6300.0 g |
| Cellulose acetate | 6300.0 g |
| Acetone | 27669.6 g |
| Water | 22680.0 g |
| Dimethyl polysiloxane | |
| (970.0 g based on 12.6 kg of toner) | |

Preparation of Removing Sheet and Image Receiving Material

The following coating solutions A and B were coated and dried on a polyethylene terephthalate film (thickness: 100 μm) to form layers A and B having the dry thicknesses of 20 μm and 1.5 μm respectively. Thus a removing sheet and an image receiving material were prepared.

| | Amount |
|---|---|
| Coating solution A | |
| Ethylene/vinyl acetate copolymer (copolymerization weight ratio = 81/19) | 15 g |
| Chlorinated polyethylene | 0.075 g |
| Fluorinated surface active agent (Florade FC-430 produced by 3M) | 0.26 g |
| Matting agent (inside: polymethyl methacrylate having a melting point of 80 to 125° C.; outside: methyl methacrylate/acrylic acid/divinylbenzene copolymer having a melting point of 0 to −25° C. (weight ratio = 98.5/3/0.5); weight ratio of inside/outside: 7/3; particle size: 20 μm) | 0.1 g |
| Toluene | 100 ml |
| Coating solution B | |
| Polyvinyl butyral | 4 g |
| Fluorinated surface active agent (Florade FC-430 produced by 3M) | 0.05 g |
| Methanol | 50 ml |
| Methyl ethyl ketone | 20 ml |
| Methyl cellosolve acetate | 20 ml |

Formation of Color Proof

A color proof was formed using the above-prepared single-layered light-sensitive material according to the transferring type of the second embodiment of the present invention.

The light-sensitive material was imagewise (for yellow image) exposed to light of 488 nm by a scanning exposure (light source: air cooling argon ion laser). The surface exposure was 3 μJ/cm². The light-sensitive material was heated for 40 seconds on a hot plate at 130° C. The overcoating layer was then peeled from the light-sensitive material. Thus the developed light-sensitive polymerizable layer was exposed. The removing sheet is placed in contact with the light-sensitive polymerizable layer, and passed through rubber rollers about at 80° C. Thus unhardened area of the polymerizable layer was removed with the sheet, and the adhesive layer under the unhardened area was exposed. The yellow toner was applied to the surface of the light sensitive material while rubbing the surface. The toner was attached to the unexposed (unhardened) area. Thus a yellow color image was formed on the light-sensitive material.

A magenta image was formed on the light-sensitive material in the same manner as in the formation of the yellow image except that the magenta toner was used.

A cyan image was also formed on the light-sensitive material in the same manner as in the formation of the yellow image except that the cyan toner was used.

A black image was further formed on the light-sensitive material in the same manner as in the formation of the yellow image except that the black toner was used.

The light-sensitive material having the black image was placed in contact with the image receiving material, and heated about at 70° C. to transfer the black toner on the adhesive layer from the light-sensitive material to the image receiving material. The cyan image was then transferred from the light-sensitive material to the image receiving material to which the black image had been transferred. The magenta image and the yellow image were transferred to the image receiving material in the same manner to form a color image on the image receiving material.

The image receiving material was placed in contact with a white art paper, and passed through rubber rollers at 120° C. to transfer the color image from the image receiving material to the white art paper. Thus a color proof was formed on the art paper. The image quality of the color proof was excellent, and the digital image data were fully reproduced in the color proof.

EXAMPLE 2

Preparation of Light-Sensitive Material for Yellow Image Formation

A light-sensitive material for yellow image formation (multi-layered light-sensitive material) was prepared in the following manner.

Preparation of Support

A biaxially stretched polyethylene terephthalate film having the thickness of 20 μm was used as the support.

Preparation of Base Precursor Dispersion

In 750 g of 3 wt. % aqueous solution of polyvinyl alcohol was dispersed 250 g of powder of the following base precursor using Dynomill dispersing device. The particle size of the base precursor was about not more than 0.5 μm.

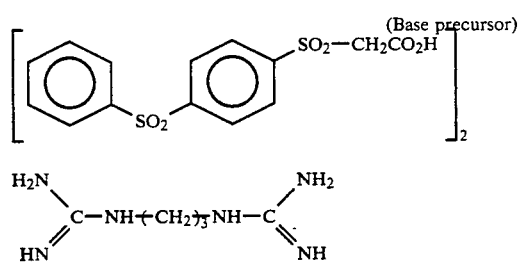
(Base precursor)

Formation of Image formation Accelerating Layer

The following coating solution was coated and dried on the support to form an image formation accelerating layer having the dry thickness of about 3.5 μm.

| Coating solution of image formation accelerating layer | Amount |
|---|---|
| 10 Wt. % aqueous solution of polyvinyl alcohol having the saponification degree of 98.5% (PVA-110 produced by Kuraray Co., Ltd.) | 100.0 g |
| Propionamide | 1.0 g |
| Base precursor dispersion | 6.3 g |

Preparation of Silver Halide Emulsion

Gelatin, potassium bromide and water were placed in a vessel and kept at 55° C. An appropriate amount of ammonium was added to the vessel. Further, an aqueous solution of silver nitrate and an aqueous solution of potassium bromide containing hexachloroiridate (III) (the molar ratio of iridium to silver is $10^{-7}$ mole) were added to the vessel according to a double jet method while keeping the pAg of 7.60 in the reaction vessel. Thus monodispersed silver bromide emulsion having the average grain size of 0.25 μm was prepared. In the emulsion, 98% of the silver halide grains are within the range of ±40% of the average grain size. The emulsion was desalted, and adjusted to pH 6.2 and pAg 8.6. To 1 kg of the emulsion was added 70 ml of methanol solution of the following infrared sensitizing dye (concentration: $9.0 \times 10^{-4}$ M/l). To 1 kg of the emulsion was further added 99 ml of methanol solution of sodium 4,4′-bis[4,6-di(naphthyl-2-oxy)pyrimidine-2-ilamino]stilbenzene-2,2′-disulfonate (concentration: $4.4 \times 10^{-1}$ M/l). To 1 kg of the emulsion was furthermore added 35 ml of methanol solution of the following stabilizer (concentration: $2.8 \times 10^{-2}$ M/l). The mixture was stirred for 15 minutes at 60° C. to prepare a silver halide emulsion.

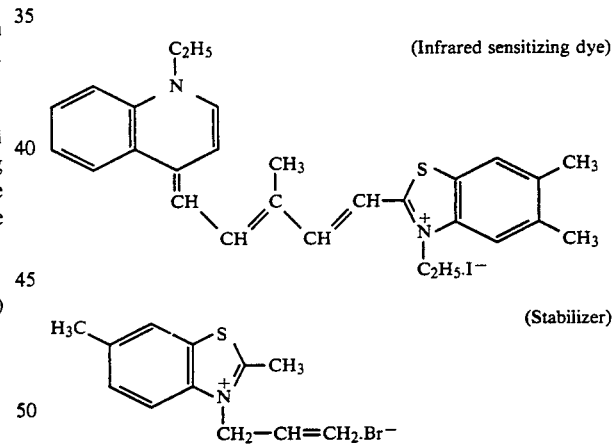

Formation of Light-Sensitive Layer

The following coating solution was coated and dried on the image formation accelerating layer to form a light-sensitive layer having the dry thickness of about 1.2 μm.

| Coating solution of light-sensitive layer | Amount |
|---|---|
| 10 Wt. % aqueous solution of polyvinyl alcohol having the saponification degree of 81% (PVA-405 produced by Kuraray Co., Ltd.) | 5.00 g |
| Propionamide | 0.24 g |
| Silver halide emulsion | 2.64 g |
| Water | 9.50 g |

Preparation of Yellow Pigment Dispersion

The following composition was dispersed at 2,000 rpm for 2 hours using a Dynomill to obtain a yellow pigment dispersion having the average particle size of 0.25 μm.

| Yellow pigment dispersion | Amount |
| --- | --- |
| The following yellow pigment (C.I.: Pigment Yellow 14) | 30.0 g |
| Allyl methacrylate/methacrylic acid copolymer (copolymerization ratio = 80/20) | 50.0 g |
| Propylene glycol monomethyl ether | 320.0 g |

(Yellow pigment)

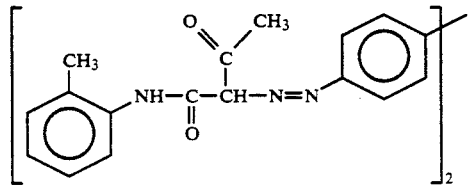

Formation of Polymerizable Layer

The following coating solution was coated and dried on the light-sensitive layer to form a polymerizable layer.

| Coating solution of polymerizable layer | Amount |
| --- | --- |
| Pentaerythritol trimethacrylate | 6.0 g |
| Allyl methacrylate/methacrylic acid copolymer (copolymerization ratio = 87/13) | 15.0 g |
| Yellow pigment dispersion | 40.0 g |
| Reducing agent (J) | 1.0 g |
| Methyl ethyl ketone | 35.0 g |
| 0.13 Wt. % methyl ethyl ketone solution of the following additive (3) | 2.65 g |
| 0.22 Wt. % methyl ethyl ketone solution of the following additive (4) | 1.10 g |

(Additive (3))

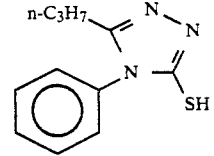

(Additive (4))

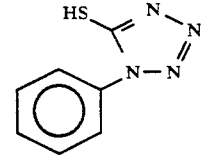

Formation of Cover Sheet

A polyethylene film having the thickness of 50 μm (cover sheet) was laminated on the polymerizable layer. Thus a multi-layered light-sensitive material for yellow image formation was prepared.

Preparation of Light-Sensitive Material for Magenta Image Formation

A light-sensitive material for magenta image formation (multi-layered light-sensitive material) was prepared in the same manner as in the preparation of the material for yellow image formation except that the following magenta pigment was used.

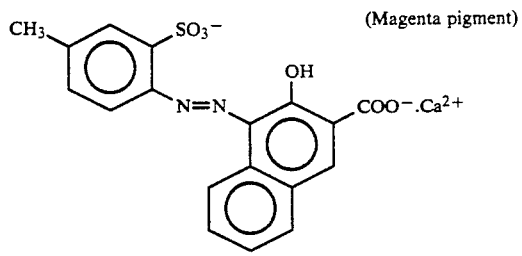

(Magenta pigment)

Preparation of Light-Sensitive Material for Cyan Image Formation

A light-sensitive material for cyan image formation (multi-layered light-sensitive material) was prepared in the same manner as in the preparation of the material for yellow image formation except that the following cyan pigment was used.

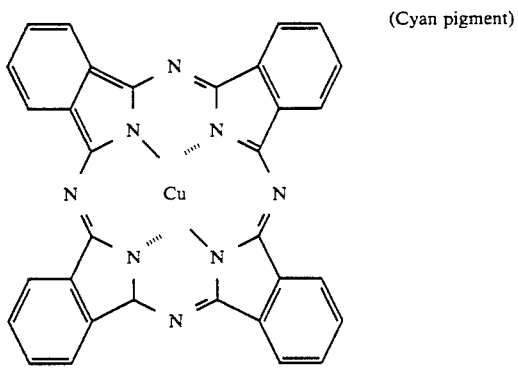

(Cyan pigment)

Preparation of Light-Sensitive Material for Black Image Formation

A light-sensitive material for black image formation (multi-layered light-sensitive material) was prepared in the same manner as in the preparation of the material for yellow image formation except that carbon black (C.I.: Pigment Black 7) was used as the black pigment.

Preparation of Image Receiving Material

The following dye was added to a gelatin solution to prepare a coating solution of a backing layer. The coating solution was coated on a biaxially stretched polyethylene terephthalate film having the thickness of 100 μm. The amount of gelatin contained in the backing layer was 3.7 g/m². The absorbance of the backing layer was 0.8 at 780 nm. Isobutylene rubber was coated on the surface (the reverse of the backing layer) of the polyethylene terephthalate film to form an adhesion layer having the thickness of 0.2 μm. Thus an image receiving material was prepared.

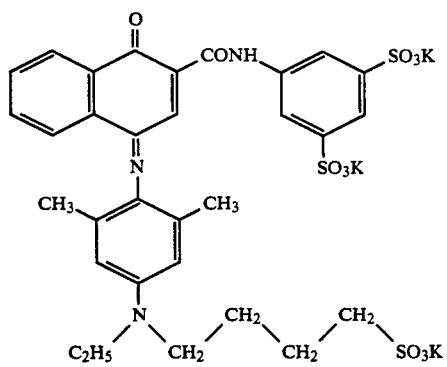
(Dye)

Formation of Color Proof

A color proof was formed using the above-prepared multi-layered light-sensitive materials according to the laminating type of the first embodiment of the present invention.

The cover sheet was peeled from the light-sensitive material. The polymerizable layer of the light-sensitive material was placed in contact with the adhesion layer of the image receiving material, and then passed through rubber rollers at 40° C. to form a lamination. The following processes were conducted while placing upside the light-sensitive material in the lamination.

The lamination was imagewise (for yellow image) exposed to light of 488 nm from the side of the light-sensitive material by a scanning exposure (light source: semiconductor laser). The surface exposure was 10 µJ/cm². The lamination was heated for 40 seconds on a hot plate at 130° C. The support of the light-sensitive material, the image formation accelerating layer and the light-sensitive layer were peeled from the lamination. The unhardened area of the polymerizable layer was removed with the sheet used in Example 1 to form a yellow image on the image receiving material.

The light-sensitive material for magenta image formation was laminated on the image receiving material, in which the yellow image had been formed. The lamination was processed in the same manner as in the formation of the yellow image.

The light-sensitive material for cyan image formation was laminated on the image receiving material, and the lamination was processed in the same manner as in the formation of the yellow image.

The light-sensitive material for black image formation was laminated on the image receiving material, and the lamination was processed in the same manner as in the formation of the yellow image.

Further, the image receiving material was washed with water to remove the backing layer. Thus a color proof was formed on the image receiving material. The image quality of the color proof was excellent, and the digital image data were fully reproduced in the color proof.

We claim:

1. An image forming method comprising the steps of (1), (2), (3) and (4):
   (1) imagewise exposing to light a light-sensitive material comprising a support and the light-sensitive polymerizable layer which contains silver halide, a reducing agent, an ethylenically unsaturated polymerizable compound or/and a cross-linkable polymer and a colorant;
   (2) developing the light-sensitive polymerizable layer to harden the ethylenically unsaturated polymerizable compound or/and the cross-linkable polymer within the exposed area or, in the alternative, within the unexposed area; and then
   (3) placing the surface of the light-sensitive polymerizable layer in contact with a removing sheet and peeling the sheet to remove the unhardened area or, in the alternative, the hardened area with the sheet to obtain a hardened image whereby a color image is formed; and
   (4) placing the light-sensitive material in contact with an image receiving material whereby the color image is transferred to the image receiving material.

2. The image forming method as claimed in claim 1, wherein the light-sensitive polymerizable layer comprises a light-sensitive layer containing the silver halide and a polymerizable layer containing the ethylenically unsaturated polymerizable compound or/and the cross-linkable polymer and the colorant, and the light-sensitive layer is removed from the light-sensitive material between the steps (2) and (3) or simultaneously with the step (3).

3. The image forming method as claimed in claim 1, wherein the steps (1) to (4) are repeated twice or more using light-sensitive materials each having a color different from each other, to form a multicolor image on the image receiving material.

4. An image forming method comprising the steps of (1), (2), (3) and (4):
   (1) imagewise exposing to light a light-sensitive polymerizable layer of a light-sensitive material, said light-sensitive material comprising a support, an adhesive layer and a light-sensitive polymerizable layer which contains silver halide, a reducing agent and an ethylenically unsaturated polymerizable compound or/and a cross-linkable polymer;
   (2) developing the light-sensitive polymerizable layer to harden the ethylenically unsaturated polymerizable compound or/and the cross-linkable polymer within the exposed area or, in the alternative, within the unexposed area;
   (3) placing the surface of the light-sensitive polymerizable layer in contact with a removing sheet and peeling the sheet to remove the unhardened area with the sheet to obtain a hardened image whereby the adhesive layer is imagewise exposed; and then
   (4) applying color toner on the surface of the adhesive layer whereby a toner image is formed.

5. The image forming method as claimed in claim 4, wherein the light-sensitive polymerizable layer comprises a light-sensitive layer containing the silver halide and a polymerizable layer containing the ethylenically unsaturated polymerizable compound or/and the cross-linkable polymer, and the light-sensitive layer is removed from the light-sensitive material between the steps (2) and (3) or simultaneously with the step (3).

6. The image forming method as claimed in claim 4, wherein the method further contains the step (5) after the step (4):
   (5) placing the light-sensitive material in contact with an image receiving material whereby the toner image is transferred to the image receiving material.

7. The image forming method as claimed in claim 6, wherein the steps (1) to (5) are repeated twice or more using color toners each having a color different from each other, to form a multicolor image on the image receiving material.

8. The image forming method as claimed in claim 4, wherein the method further contains the steps (A) and (B),
- (A) laminating the light-sensitive material on an image-receiving material; and
- (B) peeling the support of the light-sensitive material from the lamination of the light-sensitive material and the image-receiving material;

wherein (A) is prior to (B), and (B) is prior to (3).

9. The image forming method as claimed in claim 8, wherein the steps (A), (B) and (1) to (4) are repeated twice or more using color toners each having a color different from each other, to form a multicolor image on the image receiving material.

10. An image forming method comprising the steps of (1), (2), (3) and (4):
- (1) imagewise exposing to light a light-sensitive polymerizable layer of a light-sensitive material, said light-sensitive material comprising a support and a light-sensitive polymerizable layer which contains silver halide, a reducing agent and an ethylenically unsaturated polymerizable compound or/and a cross-linkable polymer;
- (2) developing the light-sensitive polymerizable layer to harden the ethylenically unsaturated polymerizable compound or/and the cross-linkable polymer within the exposed area or, in the alternative, within the unexposed area;
- (3) placing the surface of the light-sensitive polymerizable layer in contact with a removing sheet and peeling the sheet to remove the hardened area with the sheet to obtain a hardened image whereby the adhesive unhardened area is imagewise formed; and then
- (4) applying color toner on the surface of the adhesive unhardened area whereby a toner image is formed.

11. The image forming method as claimed in claim 10, wherein the light-sensitive polymerizable layer comprises a light-sensitive layer containing the silver halide and a polymerizable layer containing the ethylenically unsaturated polymerizable compound or/and the cross-linkable polymer, and the light-sensitive layer is removed from the light-sensitive material between the steps (2) and (3) or simultaneously with the step (3).

12. The image forming method as claimed in claim 10, wherein the method further contains the step (5) after the step (4):
- (5) placing the light-sensitive material in contact with an image receiving material whereby the toner image is transferred to the image receiving material.

13. The image forming method as claimed in claim 12, wherein the steps (1) to (5) are repeated twice or more using color toners each having a color different from each other, to form a multicolor image on the image receiving material.

14. The image forming method as claimed in claim 12, wherein the method further contains the steps (A) and (B):
- (A) laminating the light-sensitive material on an image-receiving material; and
- (B) peeling the support of the light-sensitive material from the lamination of the light-sensitive material and the image-receiving material;

wherein (A) is prior to (B), and (B) is prior to (3).

15. The image forming method as claimed in claim 14, wherein the steps (A), (B) and (1) to (4) are repeated twice or more using color toners each having a color different from each other, to form a multicolor image on the image receiving material.

16. An image forming method comprising the steps of (A), (B), (1), (2) and (3):
- (A) laminating a light-sensitive material comprising a support and a light-sensitive polymerizable layer which contains silver halide, a reducing agent, an ethylenically unsaturated polymerizable compound or/and a cross-linkable polymer and a colorant on an image-receiving material, said light-sensitive polymerizable layer comprises a light-sensitive layer containing the silver halide and a polymerizable layer containing the ethylenically unsaturated polymerizable compound or/and the cross-linkable polymer and the colorant;
- (B) peeling the support of the light-sensitive material from the lamination of the light-sensitive material and the image-receiving material;
- (1) imagewise exposing to light the light-sensitive polymerizable layer of the light-sensitive material;
- (2) developing the light-sensitive polymerizable layer to harden the ethylenically unsaturated polymerizable compound or/and the cross-linkable polymer within the exposed area or, in the alternative, within the unexposed area; and
- (3) placing the surface of the light-sensitive polymerizable layer in contact with a removing sheet and peeling the sheet to remove the unhardened area or, in the alternative, the hardened area with the sheet to obtain a hardened image whereby a color image is formed, wherein (A) is prior to (B), (1) is prior to (2), (2) is prior to (3), and (B) is prior to (3), and the light-sensitive layer is removed from the light-sensitive material between the steps (2) and (3) or simultaneously with the step (3).

17. The image forming method as claimed in claim 16, wherein the steps (A), (B) and (1) to (3) are repeated twice or more using light-sensitive materials each having a color different from each other, to form a multicolor image on the image receiving material.

* * * * *